United States Patent [19]

Fjelstad et al.

[11] Patent Number: 5,812,378
[45] Date of Patent: Sep. 22, 1998

[54] MICROELECTRONIC CONNECTOR FOR ENGAGING BUMP LEADS

[75] Inventors: Joseph Fjelstad, Sunnyvale; John W. Smith, Palo Alto; Thomas H. DiStefano, Monte Sereno; A. Christian Walton, Belmont, all of Calif.

[73] Assignee: Tessera, Inc., San Jose, Calif.

[21] Appl. No.: 511,131

[22] Filed: Aug. 4, 1995

Related U.S. Application Data

[62] Division of Ser. No. 254,991, Jun. 7, 1994.

[51] Int. Cl.$^6$ .............................. H05K 7/12; H01R 9/09
[52] U.S. Cl. ......................... 361/769; 361/767; 361/771; 361/772; 361/774; 361/776; 361/777; 439/82
[58] Field of Search ................................... 174/250, 253, 174/254, 260, 261, 262, 265, 267; 228/180.21, 180.22; 361/760, 767, 769, 770, 771, 772–774, 776, 777, 779, 783, 784, 785, 787, 789, 790, 803, 805, 804; 439/66, 68, 69, 71, 72, 73, 74, 77, 67, 81, 82, 83, 84, 91

[56] References Cited

U.S. PATENT DOCUMENTS

| | | |
|---|---|---|
| 3,275,736 | 9/1966 | Hotine . |
| 3,509,270 | 4/1970 | Dube et al. .............................. 174/68.5 |
| 3,528,173 | 9/1970 | Gall .......................................... 439/84 |
| 3,616,532 | 11/1971 | Beck ........................................ 29/625 |
| 3,670,409 | 6/1972 | Reimer . |
| 3,818,415 | 6/1974 | Evans et al. . |
| 3,937,386 | 2/1976 | Hartleroad et al. . |
| 3,998,377 | 12/1976 | Metz . |
| 4,107,836 | 8/1978 | Roberts ..................................... 29/625 |
| 4,121,044 | 10/1978 | Hadersbeck et al. ................... 174/254 |
| 4,283,839 | 8/1981 | Gursky . |
| 4,295,596 | 10/1981 | Doten et al. . |
| 4,597,617 | 7/1986 | Enochs . |
| 4,655,519 | 4/1987 | Evans et al. . |
| 4,695,870 | 9/1987 | Patraw . |

(List continued on next page.)

FOREIGN PATENT DOCUMENTS

| | | | |
|---|---|---|---|
| 6-85425 | 3/1994 | Japan ....................................... | 439/82 |
| WO 82075 | 6/1985 | WIPO . | |

OTHER PUBLICATIONS

"Supplementary Interconnection Devices", Ginsberg et al, Multichip Modules & Related Technologies, (pp. 201–229).

"A Tab Tape–Based Bare Chip Test and Burn–In Carrier", Nolan et al, 1994 ITAP & Flip Chip Proceedings, (pp. 173–179).

"Mechanical Interconnection System For Solder Bump Dice", Hill et al, 1994 ITAP & Flip Chip Proceedings (pp. 82–86).

"MCM To Printed Wiring Board (Second Level) Connection Technology Options", Alan D. Knight, Multichip Module Technologies and Alternatives: The Basics (pp. 504–509; 521–523).

(List continued on next page.)

Primary Examiner—Donald Sparks
Attorney, Agent, or Firm—Lerner, David, Littenberg, Krumholz & Mentlik

[57] ABSTRACT

A connector for microelectronic includes a sheet-like body having a plurality of holes, desirably arranged in a regular grid pattern. Each hole is provided with a resilient laminar contact such as a ring of a sheet metal having a plurality of projections extending inwardly over the hole of a first major surface of the body. Terminals on a second surface of the connector body are electrically connected to the contacts. The connector can be attached to a substrate such a multi-layer circuit panel so that the terminals on the connector are electrically connected to the leads within the substrate. Microelectronic elements having bump leads thereon may be engaged with the connector and hence connected to the substrate, by advancing the bump leads into the holes of the connector to engage the bump leads with the contacts. The assembly can be tested, and if found acceptable, the bump leads can be permanently bonded to the contacts.

60 Claims, 9 Drawing Sheets

U.S. PATENT DOCUMENTS

| | | |
|---|---|---|
| 4,696,096 | 9/1987 | Green et al. . |
| 4,716,049 | 12/1987 | Patraw . |
| 4,783,719 | 11/1988 | Jamison et al. . |
| 4,818,728 | 4/1989 | Rai et al. . |
| 4,846,704 | 7/1989 | Ikeya . |
| 4,887,760 | 12/1989 | Yoshino et al. . |
| 4,893,172 | 1/1990 | Matsumoto et al. . |
| 4,902,606 | 2/1990 | Patraw . |
| 4,913,336 | 4/1990 | Yamazaki . |
| 4,924,353 | 5/1990 | Patraw . |
| 4,937,006 | 6/1990 | Bickford et al. . |
| 4,950,173 | 8/1990 | Minemura et al. ............... 439/82 |
| 4,950,623 | 8/1990 | Dishon . |
| 4,970,624 | 11/1990 | Arneson et al. ............... 361/749 |
| 4,975,079 | 12/1990 | Beaman et al. . |
| 5,006,792 | 4/1991 | Malhi et al. . |
| 5,006,917 | 4/1991 | Kang et al. . |
| 5,046,953 | 9/1991 | Shreeve et al. . |
| 5,053,922 | 10/1991 | Matta et al. . |
| 5,057,969 | 10/1991 | Ameen et al. . |
| 5,086,337 | 2/1992 | Noro et al. . |
| 5,115,964 | 5/1992 | Ameen et al. . |
| 5,123,850 | 6/1992 | Elder et al. . |
| 5,131,852 | 7/1992 | Grabbe et al. . |
| 5,133,495 | 7/1992 | Angulas et al. . |
| 5,152,695 | 10/1992 | Grabbe et al. . |
| 5,154,341 | 10/1992 | Melton et al. . |
| 5,173,055 | 12/1992 | Grabbe . |
| 5,181,859 | 1/1993 | Foreman et al. . |
| 5,196,726 | 3/1993 | Nishiguchi et al. . |
| 5,199,879 | 4/1993 | Kohn et al. ............... 361/769 |
| 5,203,075 | 4/1993 | Angulas et al. . |
| 5,207,585 | 5/1993 | Byrnes et al. . |
| 5,228,861 | 7/1993 | Grabbe . |
| 5,261,155 | 11/1993 | Angulas et al. . |
| 5,261,593 | 11/1993 | Casson et al. . |
| 5,281,684 | 1/1994 | Moore et al. . |
| 5,282,565 | 2/1994 | Melton . |
| 5,328,087 | 7/1994 | Nelson et al. . |
| 5,343,366 | 8/1994 | Cipolla et al. ............... 361/749 |
| 5,346,118 | 9/1994 | Degani et al. . |
| 5,349,495 | 9/1994 | Visel et al. . |
| 5,349,500 | 9/1994 | Casson et al. ............... 361/749 |
| 5,354,205 | 10/1994 | Feigenbaum et al. . |
| 5,430,614 | 7/1995 | Difrancesco ............... 361/785 |
| 5,459,287 | 10/1995 | Swamy ............... 361/777 |
| 5,463,191 | 10/1995 | Bell et al. ............... 361/767 |
| 5,464,682 | 11/1995 | Perfecto et al. ............... 361/767 |
| 5,587,885 | 12/1996 | Swamy ............... 361/777 |
| 5,632,631 | 5/1997 | Fjelstad et al. ............... 439/82 |

OTHER PUBLICATIONS

IEE Transaction on Components, Pacaging and Manufacturing Technology, Part A, vol. 18, No. 2. Jun. 1995, "Constriction Resistance of Microcone–Based Contacts".

Design News, Jan. 17, 1994, "Tiny Filter Quashes EMI".

Electronic Buyers' News, Issue 867, Aug. 16, 1993, "Quieting Connectors Down" by David Gabel.

TRW Data Technologies 1994 Brochure.

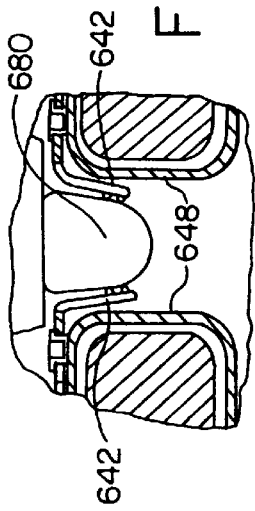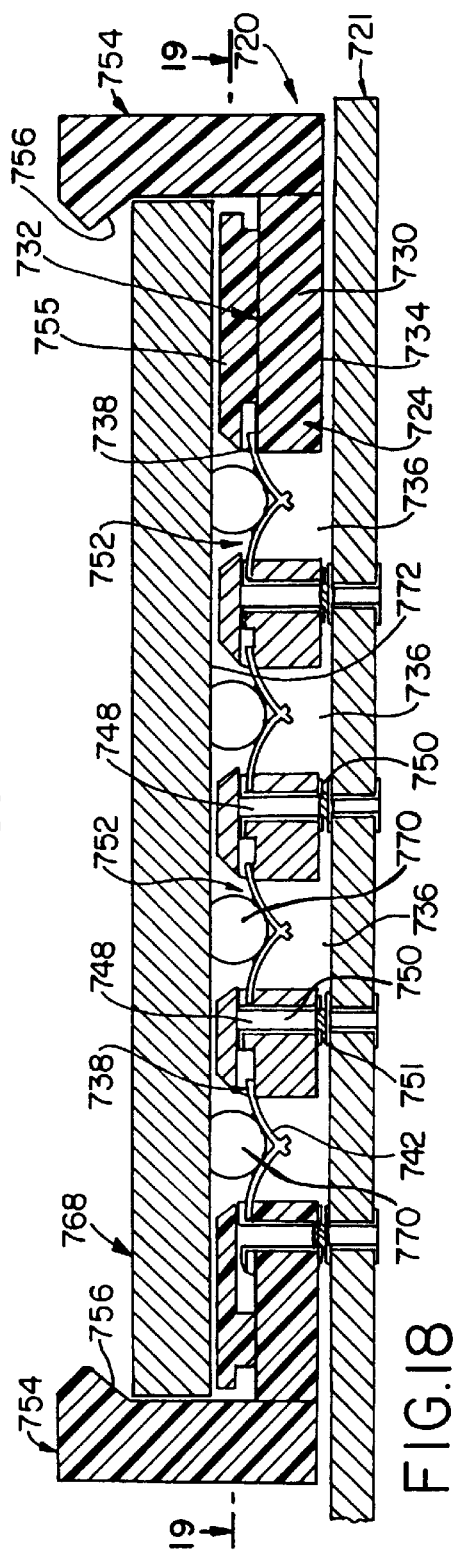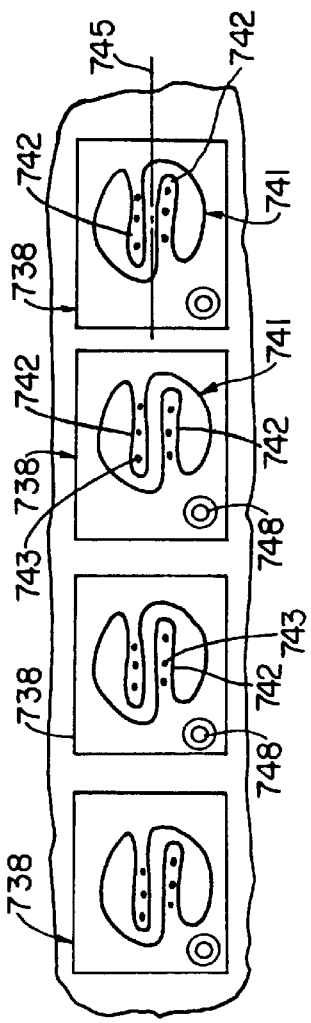

MICROELECTRONIC CONNECTOR FOR ENGAGING BUMP LEADS

This is a division of application Ser. No. 08/254,991 filed Jun. 7, 1994.

FIELD OF THE INVENTION

The present invention relates to components useful for mounting semiconductor chips and related electronic components; to assemblies made using such components and to methods of making such components and assemblies.

BACKGROUND OF THE INVENTION

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the device.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the temperatures change, the chip and substrate may expand and contract by different amounts. This causes the electrical contacts on the chip to move relative to the electrical contact pads on the substrate. This relative movement deforms the electrical interconnections between the chip and substrate and places them under mechanical stress. These stresses are applied repeatedly with repeated operation of the device, and can cause breakage of the electrical interconnections.

Moreover, despite all of the efforts made during manufacture of the chips, some chips will be defective. These defects often cannot be detected until the chip is operated under power in a test fixture or in an actual assembly. A single bad chip can make a larger assembly including numerous chips and other valuable components worthless, or can require painstaking procedures to extricate the bad chip from the assembly. Therefore, the chips and the mounting components used in any chip assembly system should permit testing of chips and replacement of defective chips before the chips are fused to a substrate. The cost of the chip and substrate assembly is also a major concern.

All these concerns, taken together, present a formidable engineering challenge. Various attempts have been made heretofore to provide first-level interconnection structures and methods to meet these concerns. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern. The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate. In wire bonded assembly, the area of the substrate occupied by the chip, the wires and the contact pads of the substrate is substantially greater than the surface area of the chip itself. Moreover, the wire bonding process does not provide any pre-testing of the chip, so that the chip must be tested using separate equipment. Thus, the bare chip must be tested using separate equipment before the wire bonding process. Testing a bare chip poses numerous practical difficulties. Thus, it is difficult to make reliable low inductance electrical connections with all of the contacts on the chip simultaneously. Elder et al, U.S. Pat. No. 5,123,850 and Jameson et al, U.S. Pat. No. 4,783,719 disclose chip testing fixtures in which conductive elements on a flexible device are pressed against electrical contacts of the chip.

In the TAB process, a polymer tape is provided with thin layers of metallic material forming conductors on a first surface of the tape. These conductors are arranged generally in a fan-out pattern and extend generally radially, away from the center of the pattern. The chip is placed on the tape in a face down arrangement, with contacts on the front surface of the chip confronting the conductors on the first surface of the tape. The contacts on the chip are bonded to the conductors on the tape. Because the leads utilized in tape automated bonding extend outwardly in a radial, fan-out pattern from the chip, the assembly is much larger than the chip itself. Enochs, U.S. Pat. No. 4,597,617 and Matta et al, U.S. Pat. No. 5,053,922 disclose variants of the TAB process in which the outer ends of the leads on the tape are placed in contact with the substrate by mechanical pressure, rather than by metallurgical bonding.

In flip-chip bonding, contacts on the front surface of the chip are provided with bump leads such as balls of solder protruding from the front surface of the chip. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, in flip-chip bonding, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it has been difficult to test a chip having an area array of contacts before attaching the chip to the substrate.

Matsumoto et al., U.S. Pat. No. 4,893,172 and Noro et al., U.S. Pat. No. 5,086,337, disclose variants of the flip-chip approach using flexible spring-like elements connected between a chip and a substrate, but in these patents both ends of each spring are metallurgically bonded to the chip and to the substrate. Nishiguchi et al, U.S. Pat. No. 5,196,726 discloses a variant of the flip-chip approach in which non-meltable bump leads on the face of the chip are received in a cup-like sockets on the substrate and bonded therein by a low-melting point material. Beaman, U.S. Pat. No. 4,975,079 discloses a test socket for chips in which dome-shaped contacts on the test substrate are disposed within conical guides. The chip is forced against the substrate so that the solder balls enter the conical guides and engage the dome-shaped pins on the substrate. Enough force is applied so that the dome-shaped pins actually deform the solder balls of the chip.

Rai et al, U.S. Pat. No. 4,818,728 discloses a first substrate such as a chip with studs or bump leads protruding outwardly and a second substrate with recesses having solder for engaging the bump leads. Malhi et al, U.S. Pat. No. 5,006,792 discloses a test socket in which a substrate has an exterior ring-like structure and numerous cantilever beams protruding inwardly from the ring-like structure. Contacts are disposed on these cantilever beams so that the same can be resiliently engaged with contacts of a chip when the chip is placed in the socket. Nolan et al, A Tab Tape-Based Bare Chip Test and Burn Carrier, 1994 ITAP And Flip Chip Proceedings, pp. 173–179 discloses another socket with cantilevered contact fingers for engaging the contacts on a chip; in this case the contact fingers are formed on a flexible tab tape and reinforced by a silicone material so as to provide forcible engagement and a wiping action with the chip contact.

Hill et al, Mechanical Interconnection System For Solder Bump Dice, 1994 ITAP And Flip Chip Proceedings PP. 82–86, discloses a test socket for flip chip devices with solder bumps. The socket has rough, dendritic structures on contact pads; here again, the chip with the solder bumps thereon is forced into the engagement with the rough, dendritic structures so as to make temporary contact for testing.

The reference "MCM to Printed Wiring Board (Second Level) Connection Technology Options" by Alan D. Knight, (in Multichip Module Technologies and Alternatives, ed. by Daryl Ann Doane and Paul D. Franzon, Van Nostrand, 1993, pp. 504–509 and pp. 521–523), together with the corresponding U.S. Pat. of Evans et al, U.S. Pat. No. 4,655,519 and Grabbe, U.S. Pat. No. 5,228,861 disclose additional connection systems using deformable contacts. Despite all of these efforts in the art however, there have still been needs for improved components for connecting semiconductor chips and other microelectronic components; for improved methods for connecting such chips and components and for improved systems which include the connected chips and components.

SUMMARY OF THE INVENTION

The present invention addresses these needs. One aspect of the present invention provides a sheet socket component for mounting a microelectronic element such as a semi-conductor chip or other element to a substrate. The sheet socket component or connector according to this aspect of the invention desirably includes a planar or sheet like dielectric body having first and second surfaces and also having a plurality of holes open to the first surface. The holes are disposed in an array corresponding to an array of bump leads on the device to be mounted. The connection further includes an array of resilient contacts secured to the first surface of the dielectric body in registration with the holes so that each such contact extends over one hole. Each contact is adapted to resiliently engage a bump lead inserted into the associated hole. The connection also includes terminals electrically connected to these contacts. Typically, the terminals are disposed in an array on the second surface of the dielectric body. Thus, the terminals may be connected to the associated contacts by leads, such as hollow barrels or vias extending through the dielectric body. A chip or other microelectronic component with the bump leads thereon can be connected to a substrate. The terminals of the connector are connected to the electrical circuit of the substrate. The microelectronic element is superposed on the dielectric body of the connector so that the microelectronic element overlies the first surface and so that the bump leads on the element protrude into the holes and are engaged by the resilient contacts. Preferred connector components according to this aspect of the invention will establish electrical connection with the bump leads and by mechanical interengagement of the bump leads and contacts.

Each contact may include a structure such as a ring of a sheet-like metallic contact material overlying the first surface of the dielectric body and encircling the opening of the associated hole, and each contact may also include one or more projections formed integrally with the ring and extending inwardly therefrom over the hole. Preferably, a plurality of such projections are provided at circumferentially-spaced locations around the hole. These projections are arranged so that when a bump lead enters the hole, it tends to force the projections outwardly, away from one another, thereby acting to center the bump in the hole. As further discussed below, such arrangements can provide reliable electrical interconnection of the bump leads with the contacts. The chip or other microelectronic component can be reliably interconnected to the substrate simply by pressing the chip against the connector in proper alignment with the holes. This reliable interconnection can be used either as a temporary interconnection for testing purposes or as a permanent connection between the chip and the substrate. Preferably, the motion of the bump leads entering the holes as the microelectronic element is engaged with the connector wipe across the contacts so as to clean debris, oxides and other contaminates from the surfaces of the contact and bump lead. The bump leads on the chips may be substantially spherical balls such as balls coated with solder or another bonding material, or else may be cylindrical conical or other projections from the surface of the microelectronic element. Additionally, the contacts may be adapted to bond with the bump leads on the chip. Thus, the contact may themselves carry a heat-activatable bonding material such as eutectic alloy, solder, diffusion bonding alloy or the like arranged to bond with the bump leads. Alternatively or additionally, the contacts can be formed from a material which is compatible with a bonding material carried by the bump leads. Such bonding will provide a permanent metallurgical connection. Thus, the chip can be engaged in with the connector and substrate mechanically and tested using the mechanically-made electrical interconnections. If the results are satisfactory, the permanent metallurgical bond can be formed.

Most preferably, the sheet like connector body of the sheet socket is less than about 1 mm thick and the holes in the body extend entirely through the body, from the first surface to the second surface. Thus, the connector does not add appreciably to the thickness of the assembly; the spacing between the chip or other element and the underlying substrate will be approximately the same as the spacing achieved by direct, flip-chip bonding of bump leads to the substrate. The holes may be closely spaced, at intervals of less than about 2.5 mm, preferably less than about 1.5 mm and more preferably about 1.0 mm or less. Preferably, the holes and overlying contacts are disposed in a first rectilinear array having row and column directions on the first surface of the body, whereas the terminals on the second surface are disposed in a similar rectilinear array having row and column directions parallel to those of the hole and contact array. However, the terminals may be offset from the holes and contacts in diagonal directions, oblique to the row and column directions of the arrays. Preferably, each terminal is connected by a conductive barrel or via to a contact body on the top surface formed integrally with the associated contact.

According to another aspect of the present invention, the holes may extend through the body so that each hole has a first surface end and a second surface end. Each terminal may be disposed on the second surface of the connector body at the second surface end of such hole. The connector may further include through conductors extending within each hole. The contact at-the first surface end of each hole may be connected to the terminal at the second surface end of the hole by the through conductor extending within the hole. Most preferably, each such through conductor is a hollow, conductive via linersubstantially lining the wall of the associated hole. In this arrangement, there is no need for a separate array of barrels or vias remote from the holes. Instead, each hole serves as a conductive via as well as a hole for receiving the bump lead. This arrangement provides an extraordinarily compact device. The pitch or distance between holes may be on the order of three times, or more preferably, two times the diameter of the bump leads to be received or even less. Although this arrangement can be used with any pitch, it is especially advantageous where the pitch is about 1.5 mm or less.

Most preferably, each via liner is metallic and has a contact support portion flaring outwardly, away from the center of the associated hole at the first surface end of the hole. Each contact desirably includes a ring-like structure of a laminar metallic contact material, the ring overlying the contact support of the associated via liner and encircling the opening of the hole at the first surface. Each ring desirably is connected to the contact support remote from the hole, i.e., adjacent to the periphery of the contact support. Each such contact may also include at least one projection, and desirably a plurality of projections, formed integrally with the ring and extending inwardly therefrom so that the projections extend over the hole. Each contact support may include an attachment means such as a plurality of plated vias or posts protruding upwardly, away from the contact support on the connector body, and connecting the contact electrically and mechanically to the contact support at positions remote from the hole. Each attachment may include a locking protrusion overlying the ring portion of the associated contact so as to lock the ring to the contact support. Preferably, the rings and the contact supports are polygonal, most preferably square, and the metal vias or posts are disposed adjacent the corners of the polygon.

A further aspect of the present invention provides methods of making connections to a microelectronic element having bump leads thereon. Methods according to this aspect of the present invention desirably include the step of engaging the microelectronic element with a sheet socket connector having a sheet-like dielectric body and having contacts on a first major surface thereof extending over holes in the body. The engagement step is performed so that the first major surface of the connector body is juxtaposed with the microelectronic element, so that the bump leads on the microelectronic element protrude into the holes in the connector body and hence through the first surface over the connector body, and so that the bump leads deform the contacts of the connector and are engaged therewith. Most preferably, the connector body closely overlies a substrate prior to the aforementioned engaging step, so that the connector forms part of the mounting assembly and so that the first surface of the connector body constitutes an exposed mounting surface of the mounting assembly. Moreover, prior to the engaging step, the contacts on the connectors desirably are connected electrically to the substrate, so that when the microelectronic element is engaged with the connector, it will be both physically juxtaposed with the mounting assembly and electrically connected thereto. The method may further include the step of bonding the bump leads to the contacts by activating an electrically conductive bonding material at interfaces between the bump leads and the contacts, as by momentarily heating the microelectronic element and the connector so as to cause a bonding material already present on the contacts and/or on the bump leads to form a flowable phase at interfaces between the bump leads and contacts.

The method desirably includes the step of electrically testing the assembled microelectronic element, connector and substrate prior to the bonding step by actuating the microelectronic element through electrical circuitry of the substrate and through the connections between the contacts and the bump leads. Thus, the assembly can be made by positioning the microelectronic element in place on the sheet socket connector mounted to the substrate and then tested. If the assembly is acceptable, the metallurgically bonded connections can be made without disengaging the microelectronic element from the connector. The assembly can be used as is, without forming the metallurgically bonded connections, leaving the microelectronic elements permanently mechanically and electrically engaged to the sheet socket connector. If the assembly is not acceptable, the microelectronic element can be separated from the remainder of the assembly and replaced by another microelectronic element. Alternatively, if the other parts of the assembly are defective, the microelectronic element can be salvaged.

The ability to test the completed assembly and replace defective parts before forming the metallurgical bonds is particularly useful where a plurality of microelectronic components are to be connected to a common substrate as, for example, in a complex hybrid circuit or module. Most preferably, the engaging step includes the step of engaging a plurality of microelectronic elements with the connector, and hence with the substrate in the same manner as described above, as by forcing the bump leads on each of the components into holes in the connector first surface so as to engage the bump leads with the contacts of the connector. After the entire assembly is tested as a unit and found acceptable, metallurgical bonds can be formed to the bump leads of all of these components in a single bonding step, as by heating the entire assemblage. Alternatively, the assembly can be operated without the step of forming a metallurgical bond between the microelectronic elements and the connector. One or more of the microelectronic elements can be socketted later, after other elements have been permanently bonded to the sheet socket by a heat activated step. The method can be practiced with plural connectors on the same substrate, so that engaging step includes the step of engaging microelectronic components with the plural connectors. Typically, the substrate is a generally planar substrate including one or more circuit panels, and the sheet socket connectors are provided on oppositely facing top and bottom surfaces of the substrate.

These aspects of the invention provide extraordinary versatility and the ability to connect many different devices. This versatility can be extended by prefabricating subassemblies including one or more electronic devices on a carrier with a generally planar undersurface and electrically connecting the devices on the carrier to bump leads projecting from the undersurface of the carrier so as to form the composite microelectronic element. Such an element can be engaged with the connector and substrate in the processes as aforesaid. In further extensions of the process, the same sheet socket connector can be used to connect the substrate to a cable, to a test fixture, to another substrate or to a larger "mother board" by use of appropriate interconnect devices such as plugs which are engaged with the connector in the same manner as the microelectronic elements. Thus, the present invention provides a complete system usable for connecting electronic elements in a wide variety of configurations. Further, the system can make use of essentially any standard pitch or spacing between bump leads; the holes in the connectors are provided at the appropriate spacings to match the standard pitch.

Yet another aspect of the present invention provides a mounting assembly for mounting and connecting a microelectronic element. The mounting assembly according to this aspect of the present invention includes a substrate having electrically conductive leads therein and means defining at least one mounting surface, with holes open to the mounting surface extending inwardly therefrom toward the substrate. The mounting assembly further includes an array of resilient contacts secured to the mounting surface in registration with the holes so that each contact extends over one such hole. Each contact is adapted to resiliently engage a bump lead inserted into the associated hole. The contacts are electrically connected to the leads in the substrate body so that a microelectronic component can be engaged with the substrate and electrically connected thereto by way of the contacts. Such a mounting assembly may include a substrate with the sheet-like dielectric body of a connector as discussed above superposed thereon. As discussed above, the holes in the mounting surface desirably are disposed in a regular grid, such as a rectilinear grid. The mounting assembly may further include barrier means for covering a portion of the grid so as to leave only one or more selected parts of the grid exposed. The barrier means may include a dielectric film covering the holes in the areas other than the selected parts. Thus, a mounting assembly as discussed above, and a connector as discussed above which may constitute the mounting surface of such a mounting assembly can be fabricated as a standard item, with holes and contacts at all portions of the rectilinear grid and may be masked as needed leaving only the appropriate contacts for a particular application exposed.

Yet another aspect of the invention provides an electronic assembly or system. The system preferably includes a mounting assembly as aforementioned and at least one microelectronic element. Each such microelectronic element has a bottom surface and a plurality of bump leads protruding from the bottom surface. Each such microelectronic element is mounted on the mounting assembly with the bottom surface of the element confronting a mounting surface of the mounting assembly, the bump leads of the element protruding into the holes of the mounting assembly at such mounting surface and engaging electrical contacts on the mounting assembly at these holes so that the bump leads are electrically connected to leads of the mounting assembly through the contacts. Such a system or assembly preferably includes plural microelectronic elements interconnected to one another through the leads of the mounting assembly. The bump leads may be either bonded to the contacts of the mounting assembly or else may be releasably engaged with the contacts, as by mechanical interengagement. Assemblies according to this aspect of the present invention can be fabricated readily, with high reliability and with extraordinary compactness.

Yet another aspect of the invention provides a socket means for testing and burning in microelectronic elements. Sheet socket connector is assembled to a burn in board or to a test board. The surface of the connector elements in the sheet socket are disposed so as not to form a permanent metallurgical bond between the connector elements and the bumps on the microelectronic device, when exposed to temperatures used for burning in or testing the device. The device under test is held in place on the sheet socket connector by a pressure clamp, which clamp can be suited for removal of heat from the device. The sheet socket is well suited for mounting and electrically connecting many similar microelectronic devices to a burn in board, so as to dynamically burn in the devices at high temperature while supplying each with drive voltages. In order to maintain good electrical contact with each bump of the microelectronic device during the test or burn in procedure, each of the resilient contact elements is preferably patterned with hard metallic asperities that break through surface contamination and oxides on each bump, and maintain good electrical contact with the bump during the procedure. When sheet socket connectors are used for electrical test and burn in, it is preferable that the resilient projections on the contacts are deformed elastically by insertion of the bumps of the microelectronic element into the holes. For electrical test and burn in, a perforated dielectric sheet is placed between the contact elements and the microelectronic device, where the holes in the perforated sheet line up with the holes in the body of the sheet socket, in order to prevent the bumps from penetrating so far into the holes of the socket that the resilient material is deformed plastically.

The foregoing and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 17 is a fragmentary diagrammatic sectional view depicting portions of the component illustrated in FIGS. 15—16.

FIG. 18 is a diagrammatic sectional view depicting components in accordance with yet another embodiment of the invention.

FIG. 19 is a fragmentary sectional view taken along line 19—19 in FIG. 18.

DETAILED DESCRIPTION OF THE PREFERRED EMBODIMENT

Figure 1:
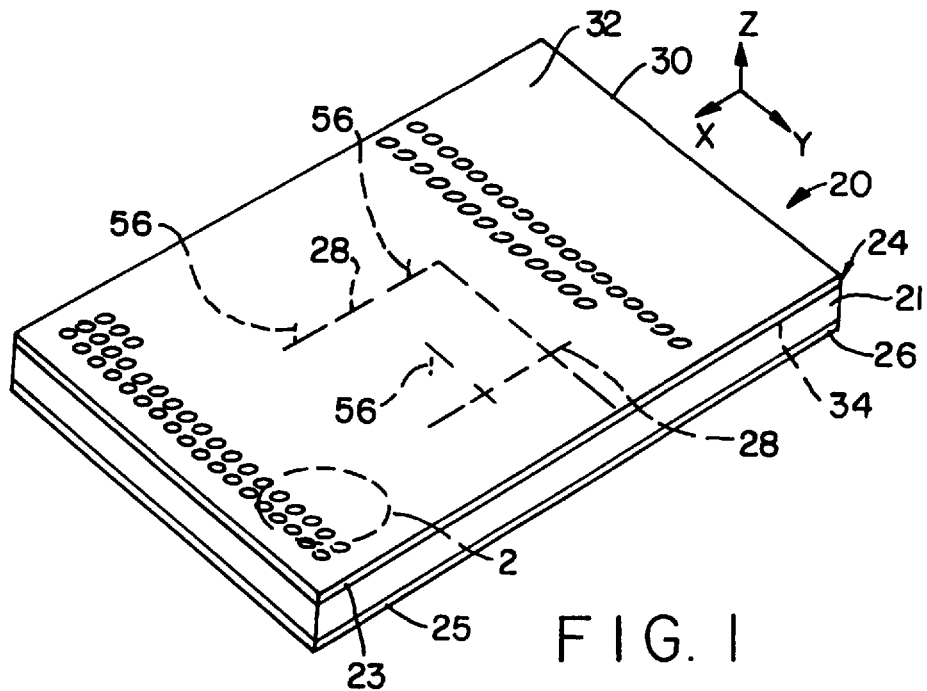
FIG. 1 is a diagrammatic perspective view of a mounting assembly and connectors in accordance with one embodiment of the invention.

A mounting assembly 20 according to one embodiment of the present invention includes a generally planar substrate 21 having a top surface 23 with a first connector 24 disposed thereon and an oppositely facing bottom surface 25 with a second connector 26 on the bottom surface. Substrate 21 in this arrangement is a multi-layer laminated circuit panel with numerous electrical leads 28, of which only a few are schematically indicated. Leads 28 extend in mutually orthogonal, horizontal directions parallel to the top and bottom surfaces. In accordance with conventional semiconductor industry practice, the horizontal directions are referred to as the "x" and "y" directions. The substrate further includes vertical or z-direction leads 56 interconnecting the various horizontal connectors 28. Some of the z-direction leads are exposed at the top surface 23. These exposed leads are disposed in a rectilinear grid of uniform pitch in the x- and y-directions. Exposed leads 56 may include, for example, flowable conductive materials such as solders, eutectic bonding alloys, polymeric materials with metallic fillers and the like, and may also include structures such as vertically extensive vias. The substrate is formed principally from dielectric materials supporting and insulating the leads. Substrate 21 may also include other elements conventional in a multi-layer circuitry, such as ground and power potential planes and the like.

Figure 2:
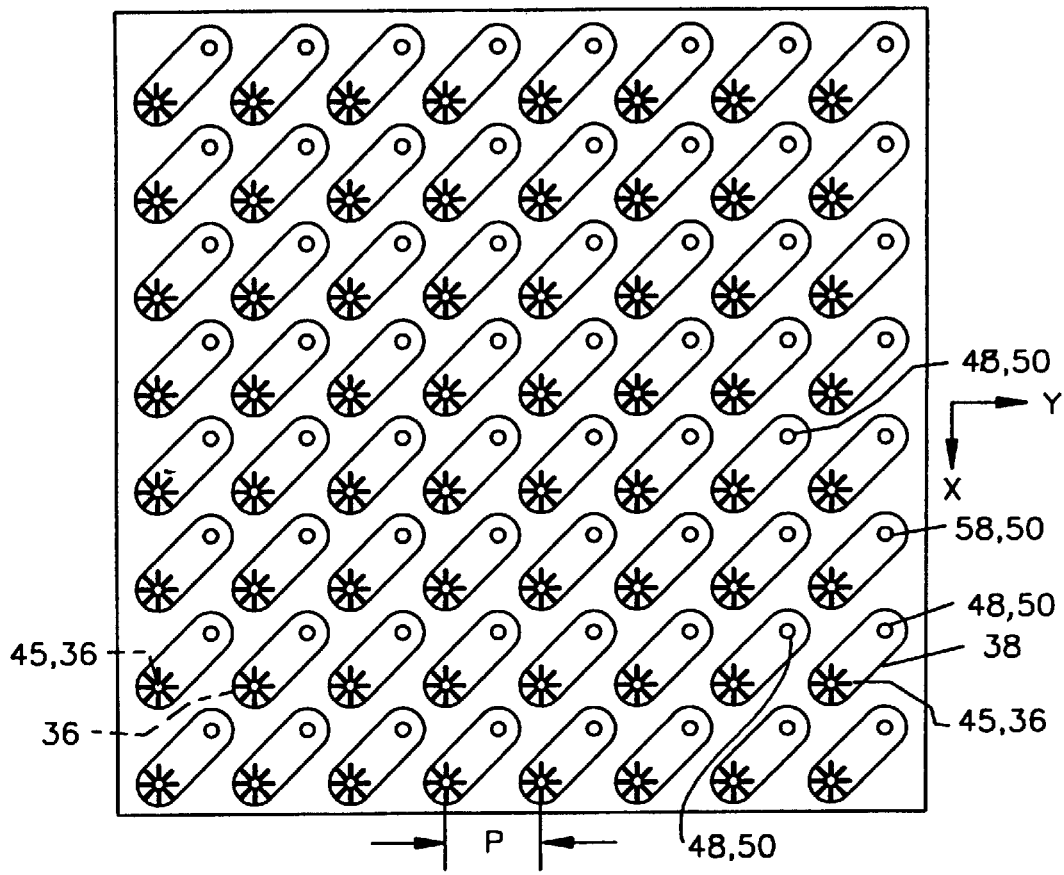
FIG. 2 is a fragmentary plan view depicting a portion of a connector illustrated in FIG. 1.
Figure 3:
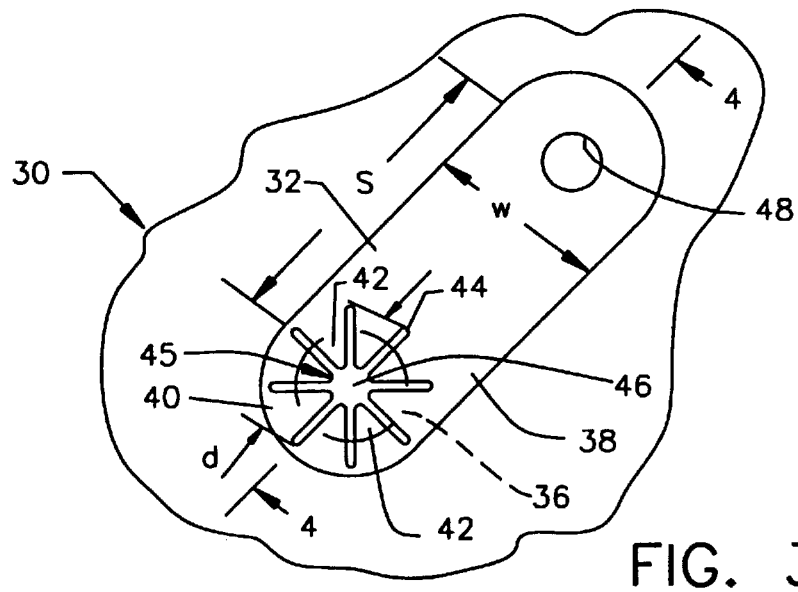
FIG. 3 is a further fragmentary plan view, on an enlarged scale, depicting a smaller portion of the same connector.
Figure 4:
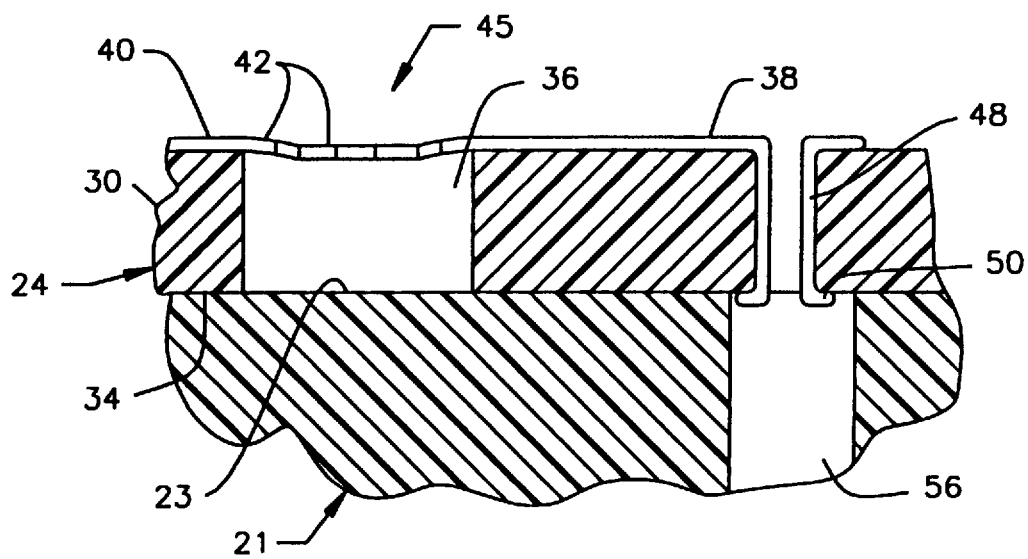
FIG. 4 is a diagrammatic sectional view taken along lines 4—4 in FIG. 3.

Connector 24 includes a sheet-like dielectric connector body 30 having a first surface 32 facing upwardly, away from the substrate 21 and a second surface 34 facing downwardly, toward the substrate. The connector body 30 has numerous holes 36 (FIGS. 2 and 4) extending through it from first surface 32 to second surface 34 and hence extending downwardly to the top surface 23 of the substrate. Connector body 30 is desirably less than about 1 mm thick, more desirably between about 0.5 and about 1.0 mm thick. As further discussed hereinbelow, the connector body thickness should be approximately equal to, or slightly more than, the distance by which the bump leads of the microelectronic elements protrude beyond the surface thereof. Holes 36 desirably are about 0.75 to about 0.80 mm in diameter. As shown in FIGS. 3 and 4 an elongated metallic contact tab 38 is associated with each hole 36. Each contact tab overlies the first surface 32 of the connector body. Each contact tab includes a ring-like structure 40 at one end encircling the opening of hole 36 and a plurality of projections 42 extending inwardly from the ring-like element, the projections protruding over the opening of the hole 36.

Projections 42 are separated from one another by slots 44.

The projections 42 of each contact tab cooperatively define an active contact 45 overlying hole 36 and encircling a central clear opening 46.

As seen in FIG. 4 each contact tab extends to a hollow metallic via 48 extending through the connector body to the second surface 34 thereof. Each such via defines a terminal 50 on the second surface 34 of the connector. As seen in FIG. 2, the holes 36 and active contacts 45 are arranged in rows extending in the x-direction and columns extending in the y-direction. Each contact tab 38 is arranged at an oblique angle, at 45° to the x-direction (and hence 45° to the y-direction), so that each via 48 and hence each terminal 50 is offset in this oblique direction from the active contact 45 and hole 36. Thus, the vias 48 and the terminals 50 at the bottom ends of the vias are also arranged in a rectilinear array of rows and columns extending in the x- and y-directions, but this array is offset from the arrays of holes 36 and active contacts 45. Other oblique angles may be employed.

The rectilinear arrays can have essentially any pitch or spacing between adjacent elements. Preferably, however, the pitch of each array is a pitch which corresponds to a standard pitch for contacts on the surfaces of microelectronic elements such as semi-conductor chips having "area array" contacts. Current standard contacts normally have a pitch P of about 2.5 mm or less between adjacent elements as measured along a row or along a column and more typically about 1.5 mm. The pitch of the via and terminal array should also match the pitch of the array of exposed leads 58 on the substrate.

Contact tabs 38, and the projections 42 incorporated therein, are generally laminar. As used in this disclosure, the term "laminar" means sheetlike or platelike. That is, a laminar structure has two oppositely-directed major faces and has edges, the major faces having surface areas substantially greater than the surface areas of the edges. A laminar structure is not necessarily planar. Contact tabs 38 may be formed from metallic materials, preferably those having substantial spring characteristics, good electrical conductivity and good processing properties in etching and plating processes such as those commonly used for microelectronic components. The materials which can be used include copper and copper-bearing alloys such as beryllium copper and phosphor bronze. The metal of the contact tab and of the projection desirably is between about 10 microns and about 50 microns thick. Standard processing techniques can be used to fabricate the contact tabs. However, processes especially adapted for forming projections extending over holes in a dielectric layer are illustrated in U.S. Pat. No. 5,148,266, and particularly at FIG. 13 thereof, the disclosures which are hereby incorporated by reference herein. The dimensions of the components will vary somewhat depending upon the pitch selected and upon the nature of the microelectronic components to be engaged with the connector. However, for a system having pitch of about 1.5 mm, the width W of each contact tab is about 0.9 mm, whereas the length L between the center of the active contact 45 and hole 36 and the center of the associated via 48 may be about 1.0 mm. The radial extent of each slot 44, towards and away from the center of clear region 46 desirably is about 0.63 mm, whereas each slot 44 may be about 0.06 mm wide. The clear central region 46 may have a diameter of about 0.08 mm, whereas the diameter D of the active contact, measured across two radially opposite slots 44 may be about 0.63 mm.

Vias 48 may incorporate metallic or other conductive materials of the types commonly used to form vias in circuit panels. The materials include metals which can be deposited by electroplating or electroless plating and the like, such as copper, nickel, gold and alloys thereof. The terminals 50 may be formed integrally with the via in a standard plating process. Connector 20 is disposed on the top surface of substrate 21 so that the second surface 34 of the connector dielectric body 30 closely overlies the top surface 23 of the substrate. The array of terminals 50 on the second surface of the connector body is disposed in registration with the array of exposed leads 56, so that each terminal 50 is engaged with one exposed lead of the substrate. The terminals 50 and exposed leads 56 are electrically connected to one another. Each exposed lead 56 is connected to internal circuitry within the substrate 21, such as x- and y-direction leads 28. The internal structure of the circuit panel may take any convenient form including, without limitation, the structures illustrated in published International Patent Application No. 92/11395 filed Dec. 30, 1992, the disclosure of which is hereby incorporated by reference herein. Said international application also discloses methods of interconnecting layers of circuitry using flowable conductive materials. These techniques may be used to interconnect connector 24 with the substrate.

Figure 7:
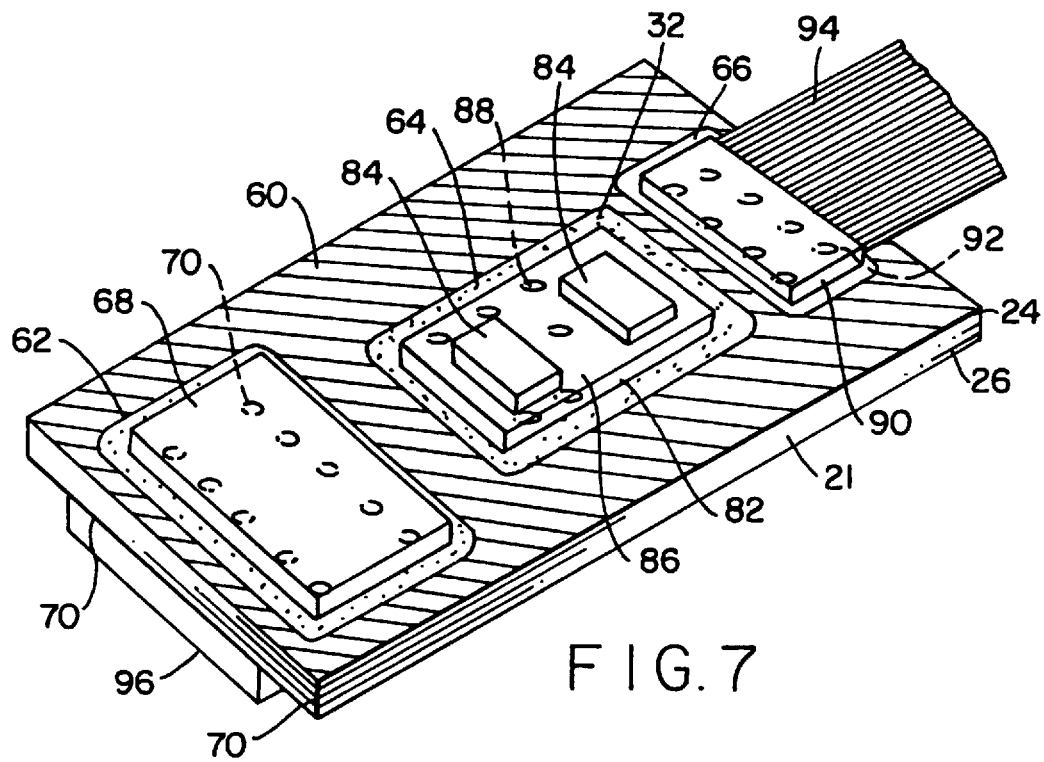
FIG. 7 is a view similar to FIG. 1, but depicting a completed electronic assembly made using the mounting assembly and connectors of FIG. 1.

The connector 26 on the bottom surface 25 of the substrate has exactly the same structure as the connector 24 on the top surface of the substrate. In this instance as well, the contact-bearing first surface of the connector dielectric body faces away from the substrate 21; i.e., downwardly, away from the bottom surface 25. Thus, the terminals of the second connector 26 on the bottom surface are electrically connected to further exposed leads (not shown). Substrate 21 and connectors 24 and 26 cooperatively form a unitary mounting assembly 20 with exposed mounting surfaces defined by the first surfaces of the two connectors and with holes extending into the mounting assembly from the surfaces, such as the holes 36 of the first connector. The contacts overlying these holes are electrically connected to conductors within the substrate. The mounting assembly further includes a means for covering such as dielectric mask layer 60 (FIG. 7) overlying parts of the exposed, first surface 32 of the top connector 24. The mask layer covers some of the contacts and some of the holes of the top connector. However, the mask layer has apertures 62, 64 and 66. The positions of the apertures are selected as desired to accommodate the desired mounting positions of various components to be assembled with the mounting assembly. Layer 60 with its apertures can be formed either by die-cutting or etching a sheet of dielectric material, or else can be made by laminating a lithographically formed sheet of dry film dielectric material onto the first surface of the connector. Preferably, layer 60 is formed from a material referred to as "coverlay", which includes a polyimide dielelectric layer and an adhesive layer which serves to fasten the dielectric layer to the connector.

Figure 5:
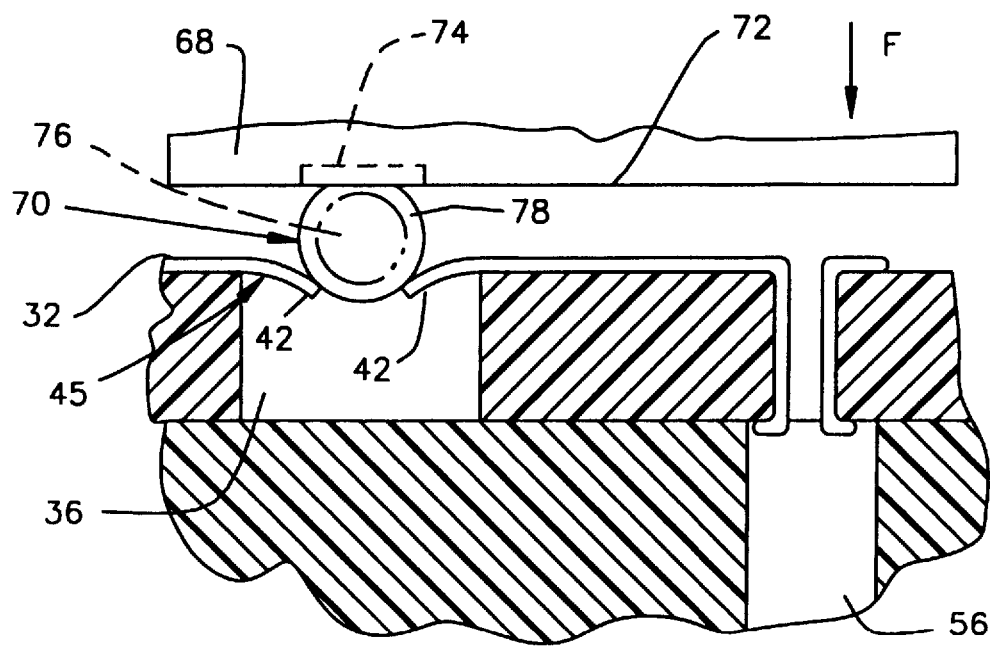
FIGS. 5 and 6 are fragmentary sectional views similar to FIG. 4 but depicting the connector, the mounting assembly and a chip during an assembly process.

In a connection method, a microelectronic component such as a semiconductor chip 68 is engaged with the connector. Microelectronic element 68 has a plurality of bump leads 70. As best seen in FIG. 5, each bump lead 70 protrudes from the planar bottom surface 72 of element 68. The bump leads are disposed in a rectilinear grid having the same pitch as the grid of active contacts 45 and holes 36 (FIG. 2). In this regard, although the bump leads should be disposed only at the locations defined by such grid, there is no requirement that a bump lead be present at every such location. That is, the grid of bump leads need not be fully populated. For example, the bump leads may be disposed at every other location, every third location, and so on so that the populated locations, with the bump leads have an effective pitch of 2, 3 or some other integral multiple of the pitch of the holes in the connector.

Each bump lead 70 is in the form of a generally spherical ball electrically connected to the internal circuitry 74 of element 68. Bump leads in this generally spherical configuration are sometimes referred to as "ball leads." Each ball lead includes an internal sphere or core 76 formed from an electrically conductive, relatively strong metal such as copper or nickel. Each sphere 76, in turn, is covered with a layer 78 of an electrically conductive, heat-activatable bonding material such as a solder.

Microelectronic element 68 is engaged with the mounting assembly 20, and with the top connector 24 by juxtaposing the element with the mounting assembly so that the contact-bearing surface 72 of the microelectronic element confronts the exposed or first contact-bearing surface 32 of the connector; i.e., so that the contact-bearing surface of the microelectronic element confronts the exposed mounting surface of the mounting assembly defined by the first surface 32 of the connector. The microelectronic element is positioned so that the bump leads 70 are in registration with the active contacts 45 and holes 36 of the connector. Element 68 and mounting assembly 20 are forced towards one another, as by forcing the element 68 downwardly. In this operation, the bump leads 70 engage the projections 42 of each contact and penetrate into holes 36. As this action continues, the bump leads penetrate further into the holes. During this operation, the projections 42 of the contacts bear against the exposed surfaces of the bump leads 70 under their own resilience, so that the projections wipe and scrape the exposed surfaces of the bump leads as the bump leads enter the holes. This action removes debris and oxides from the surfaces of the bump leads and from the surfaces of the projections.

Figure 6:
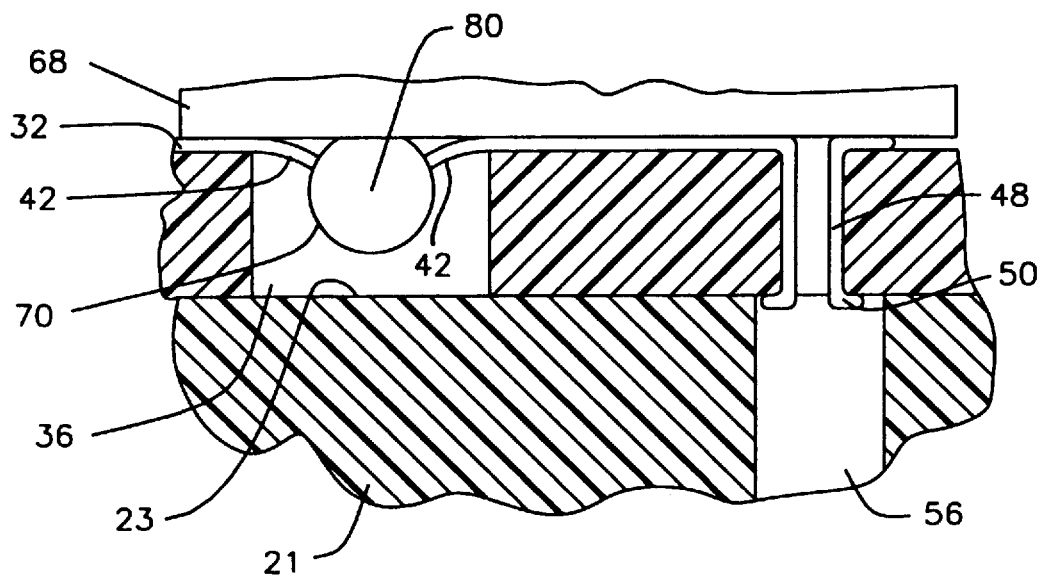

The downward motion of the microelectronic element 68 relative to the mounting assembly and connector continues until the parts reach the position illustrated in FIG. 6. In this position, the contact-bearing surface 72 of element 68 is bottomed on the exposed surface 32 of the connector; i.e., on the mounting surface of the mounting assembly. Also in this position, the center 80 of each ball constituting a bump lead lies below the first surface 32 of the connector and below the projections 42 so that the projections 42 secure the bump lead in position. In this condition, however, the microelectronic element 68 still is not irrevocably secured to the mounting assembly. Nonetheless, the resilient projections 42 make effective electrical contact with each bump lead 70.

Other components are connected to the mounting assembly in the same manner. For example, a further, relatively small substrate or carrier 82 may be provided with further microelectronic elements 84 mounted to substrate 82 by any known technique, such as by surface mount attachment by wire bonding or the like. Thus, the top or exposed surface 86 of carrier 82 may have any desired configuration compatible with the mountings used to attach components 84. The opposite or bottom surface of the carrier (the surface facing towards substrate 21), however, is generally planar and has bump leads 88 identical to the bump leads 70 discussed above. Once again, the bump leads are disposed at locations of a rectilinear grid corresponding to the grid of holes 36 in the mounting surface of the connector body; i.e., the holes in the mounting surface of the mounting assembly. Thus, carrier 82 acts as an adapter, allowing devices having diverse types of contacts to be mounted on the mounting assembly. Carrier 82 is engaged with the contacts of mounting assembly 20 in exactly the same manner as element 68. Likewise, a plug 90 is provided with a generally planar lower surface and with bump leads 92 extending therefrom. The bump leads are electrically connected to conductors of a flat cable 94. Plug 90 may be engaged with mounting assembly 20 in the same manner as carrier 82 and microelectronic element 68. Further, the flat cable plug may have through hole conductors to allow additional plugs to be connected on top of the first in order to form a stack of plugs, each of the contacts of which are electrically connected in parallel. One or more further microelectronic elements 96 are mechanically and electrically connected to mounting assembly 20 by engaging bump leads (not shown) on element 96 with the contacts carried by the lower connector 26 of the mounting assembly. Further elements (not shown) can be engaged with the upper or lower connectors. As illustrated, each of the components engaged with the top connector 20 is disposed within one of the apertures 62, 64, 66. The remaining unused space and holes are blocked by coverlay layer 60 and by a similar layer on the lower connector.

In this condition, all of the components are fully interconnected with one another and can be fully operated at normal speeds. The testing operation can be conducted by supplying power and applying test signals through cable 94. Alternatively or additionally, mounting assembly 20 may have a special test connection region (not shown) for providing power and test signals. Thus, the entire assembly and each of the components such as microelectronic element 68 will be tested while in an installed, engaged position on the mounting assembly, with signals and power supplied through the substrate and the connector. If the assembly works properly in such a test, there is excellent assurance that the device will work properly in service. Moreover, the test does not require engagement of the chip or of the bump leads with a special test socket. After test of the assembly, the special test connection is removed from the assembly.

If a defect is found, the defective component or components can be disassembled from the mounting assembly simply by pulling the component away from the mounting assembly so as to disengage the bump leads on the component from the contacts. The contacts can be reused by the next component. If no defect is found, the assembly can be used in service without further processing of the connections. The resilient engagement of the contact projections with the bump leads will provide a long-lived electrical connection. Preferably, however, the bump lead are metallurgically bonded to the contacts after the testing step. This can be done by heating the assembly so as to actuate the bonding material on the bump leads and thereby form metallurgical bonds between the bump leads and the contacts. There is no need to remove the microelectronic elements or other components from the mounting assembly, or to alter the engagement between the bump leads and the contacts between the testing step and the bonding step. Accordingly, there is an extremely high probability that, if the assembly tests acceptably in the testing step, it will continue to be acceptable after the metallurgical bonding step. In service, the vias 48, contact tabs 38 and resilient contact projections 42 can deform enough to permit some movement of the bump leads in the x- and y-directions relative to the substrate. This aids in compensating for thermal expansion.

Figure 8:
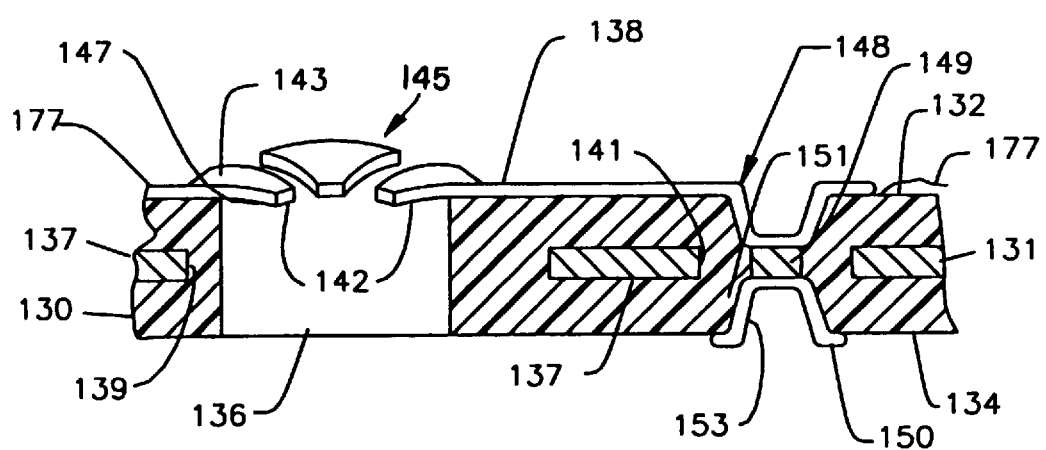
FIG. 8 is a fragmentary sectional view similar to FIG. 4, but depicting a connector in accordance with another embodiment of the invention.

A connector in accordance with a further embodiment of the invention is partially illustrated in FIG. 8. In this case, the dielectric connector body 130 has a sheet-like conductive equipotential plane member 137 disposed between the first surface 132 and the second surface 134 of the connector body. Member 137 may be formed from a conductive material such as copper or other metal, and may be electrically connected to ground or power connections (not shown) to provide a ground or power plane. The holes 136 in connector body 130 extend through apertures 139 in the potential plane member 137, so that bump leads entering into the holes will remain electrically isolated from the potential plane member. The vias or through conductors 148 extend through other apertures 141 in the potential plane member. Each via is a composite structure including a central body 149 of conductive material and a pair of blind vias 151 and 153 extending into central body 149 from the first and second surfaces, respectively, of the connector body. Blind via 153 defines the terminal 150 on the second surface 134 of the connector body.

The active contact region 145 of the contact tab includes resilient projections 142 extending radially inwardly over hole 136 at the opening of the hole on the first surface 132. Projections 142 are arranged in a similar pattern as those discussed above, and connected to a ring-like region of the contact tab 138 encircling the hole 136. In this embodiment, however, the projections 142 extend downwardly, into the hole 136, from the first surface 132 toward the second surface 134, so that the tip of each projection is recessed below the first surface. Thus, although each projection is substantially laminar, the projections 142 cooperatively define a conical lead-in or funnel-shaped structure at each hole. These structures aid in alignment of the microelectronic component with the connector during assembly; the bump leads tend to move towards the center of the funnel-shaped structures and thus towards the centers of the holes. Projections 142 typically are formed as portions of a flat sheet with ring regions 138 and with the other parts of the contact tabs, whereupon the projections of the resilient contact are permanently and plastically deformed from their original flat condition to the condition illustrated in FIG. 8 by means of an embossing process.

Also, projections 142 include a base metal 147 and a bonding material 143 overlying the base metal. The base metal 147 desirably is a metal or alloy as discussed above with reference to the contact tabs. The bonding material 143 may be a solder, a solder paste, a low temperature eutectic bonding material, a solid state diffusion bonding material, a polymer/metal composite bonding material, or other heat-activatable bonding material. For example, a solder paste such as Koki RE4-95K, a 63%tin-37%lead solder with 20–50 micron size distribution in a no-clean flux is preferred for bonding to a eutectic solder bump. Polymer/metal bonding material may include a dispersion of a metal such as silver or gold particles in a thermoplastic polymer such as Ultem® material or thermosetting polymer such as an epoxy. Diffusion bonding materials may include layered structures of gold on nickel; alloys of gold and tin such as 80% gold, 20% tin; and alloys of tin and silver such as 5% silver, 95% tin. Solders may include alloys such as tin-lead and tin-indium-silver. Eutectic bonding materials may be selected from the group consisting of alloys of gold-tin, gold-germanium, gold-silicon or combinations of these metals, the gold-tin alloys being preferred. As is well known in the art, each type of bonding material normally is employed to bond structures compatible with the bonding material. For example, eutectic bonding materials and diffusion bonding materials are employed with contact base metal layers and with mating bump leads of metals such as gold adapted to form alloys with the bonding material. In this arrangement, there is no need for the bump leads on the components to have a bonding material.

This connector further includes a layer 177 of a heat-activatable adhesive of the type commonly referred to as a "snap-cure" adhesive, on first surface 132. When the assembly is heated to activate the bonding material 143 on the contact, adhesive 177 bonds the chip or component to the mounting assembly to form a void-free interface. Moreover, the adhesive forms a seal around each contact and hole, so as to isolate the interiors of the holes and the interfaces between the bump leads and the contacts from contaminants in the environment. One suitable snap-cure adhesive is sold under the trademark ABLEBOND by the Ablestik Electronic Materials & Adhesives Company of Rancho Dominguez, California. Alternatively, a thermoplastic layer 177 may be used on the first surface 137 of the sheet socket as an adhesive for bonding the chip to the socket, where the chip can be removed from the socket by heating and reflowing the thermoplastic material. A preferred thermoplastic material for this reworkable adhesive layer is pollyimide-siloxane. In other respects, the connector of FIG. 8 is used in the same manner as the components discussed above with reference to FIGS. 1–7.

Figure 9:
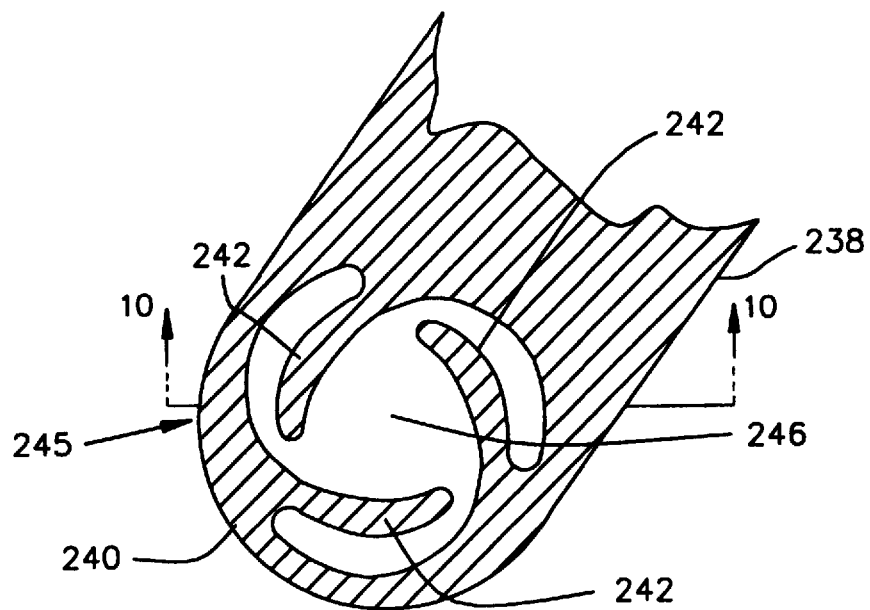
FIG. 9 is a fragmentary plan view depicting a part of a connector in accordance with another embodiment of the invention.

As illustrated in FIG. 9, a metallic contact tab 238 may have an active connector portion 245 including a ring-like region 240 encircling a central opening 246. Projections 242 spiral inwardly from the ring-like portion toward the center of this opening. In this embodiment, however, the projections do not extend directly radially inwardly, but instead extend both radially inwardly and circumferentially around the center of opening 246. Such projections provide substantial radial compliance. That is, projections 242 can deflect in directions transverse to their lengths and thus can move radially outwardly.

Figure 10:
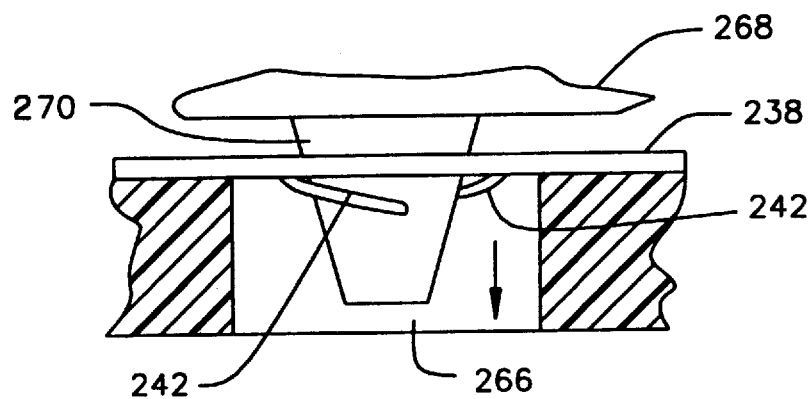
FIG. 10 is a fragmentary sectional view depicting a part of the connector of FIG. 9 in conjunction with a microelectronic component.

As illustrated in FIG. 10, a connector of the type depicted in FIG. 9 is being engaged with a microelectronic element or semiconductor chip 268. The bump leads 270 of chip 268 are not spherical as in the embodiments discussed above, but rather are truncated, conical structures. As each such bump lead enters into the opening 246 and moves downwardly into the hole 236 in the connector body, the circumferential surface of the bump lead is engaged and scraped by the projections 242 of the contact. Here again, either the contacts or the bump leads, or both, may be provided with bonding materials.

Figure 11:
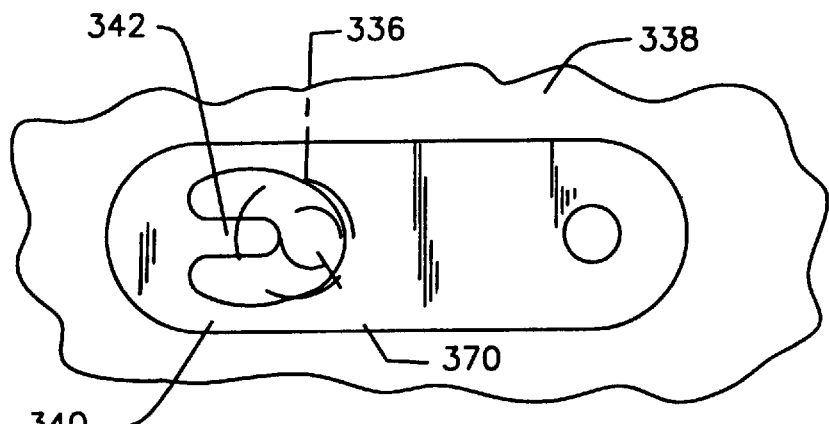
FIG. 11 is a fragmentary plan of view similar to FIG. 3, but depicting a portion of a connector in accordance with yet another embodiment of the invention.

As illustrated in FIG. 11, a contact tab 338 may have a ring-like structure 340 defining a non-circular opening, and may have only a single projection 342 extending into that opening from one side thereof. This structure may be disposed asymmetrically with the associated opening 336 in the connector dielectric body so that a bump lead 370 entering into the hole 336 will become trapped between projection 342 and the side wall of the hole.

Figure 12:
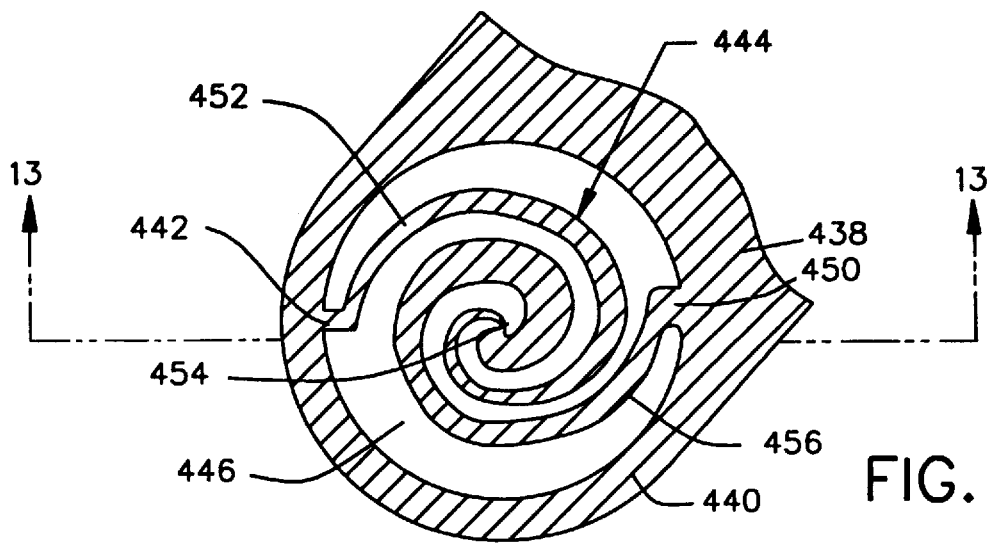
FIG. 12 is a fragmentary plan view depicting a portion of a connector in accordance with yet another embodiment of the invention.
Figure 13:
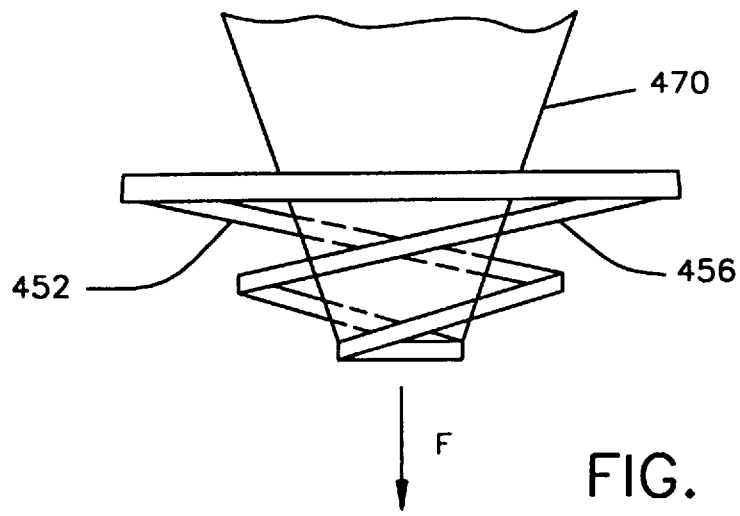
FIG. 13 is a fragmentary sectional view depicting operation of the connector of FIG. 12 during assembly to a microelectronic element.

A contact according to yet another embodiment of the invention is schematically illustrated in FIGS. 12 and 13. The contact body 438 again has a ring-like structure 440 defining an opening 446. In this structure, however, the structure includes a laminar substantially planar bridge structure 444 extending between two points 448 and 450 on opposite sides of the opening. Bridge structure 440 in turn includes a first resilient laminar spiral 452 extending from point 442 to a central point 454 and a second resilient laminar spiral 456 extending from point 450 to central point 454. Spirals 452 and 456 are of the same hand, and are intermeshed with one another. As illustrated in FIG. 13, the spirals can deflect downwardly upon application of a force F by a bump lead. Each of the spirals acts essentially as a coil spring. Moreover, the deformed spirals wrap around the sides of the bump lead 470, and wipe the surface of the bump lead. This arrangement provides the ability to resiliently engage a wide range of contact sizes.

Figure 14:
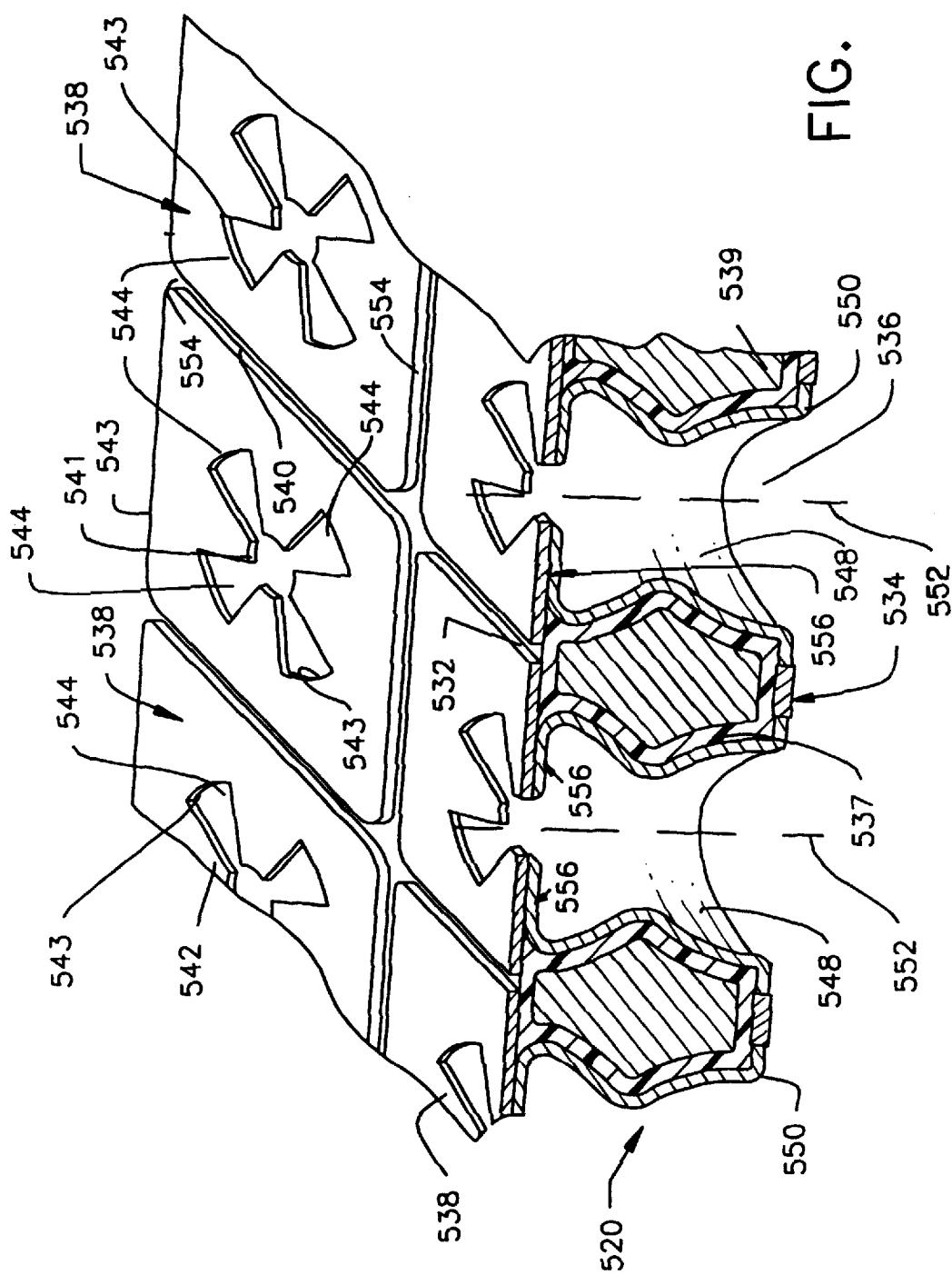
FIG. 14 is a diagrammatic, partially sectional perspective view depicting a component in accordance with a further embodiment of the invention.

A connector 520 in accordance with another embodiment of the invention is depicted in FIG. 14. This connector has a body including a metallic interior layer 539. Body 520 is generally sheet-like or laminar and has a top or first major surface 532 and a bottom or second major surface 534. The metallic layer is penetrated by holes 536 and covered by a dielectric layer 537 so that the dielectric layer lines the interior holes and also covers the metal layer at the top or first surface 532 and at the bottom or second surface 534 of the body. Layer 539 constitutes the major part of the thickness of body 520. Holes 536 have a double-tapered shape, being slightly larger in diameter adjacent each surface of 532 and 534 and having a smaller, minimum diameter at the medial plane over the body, remote from the surfaces. Preferably, holes 536 are formed by etching metal layer 539 from both major surfaces. Dielectric layer 537 may be deposited as a conformal coating on the etched metal by processes such as electrophoretic coating of a dielectric film such as epoxy or poly-methyl methacrylate. Dielectric layer 537 may be on the order of 0.02–0.06 mm and preferably about 0.04 mm thick. Each hole also has a metallic through conductor 548 extending from the first-surface end of the hole adjacent surface 532 to the second surface and adjacent second surface 534. The through conductors are in the form of hollow via liners or coatings closely overlying the dielectric layer 537 on the circumferential wall of the hole. Thus, the liners do not substantially fill holes 536. Each of the liners 548 flares outwardly at the second-surface end of the hole to form an annular terminal 550 surrounding the hole on the second surface 534 of the body.

Contacts 538 are formed as rings having a generally square outside or peripheral edge 540 with a pattern of four equally spaced slots 544 in each such ring interspersed with four radial projections 542. The slots terminate in arcuate edges 543 which cooperatively define a circular opening, so that the projections 542 extend radially inwardly from the periphery of the circular opening. The center of each such circular opening is coincident with the center 541 of the square outer periphery of the contact. Likewise, the clear opening defined by the tips of the projections 542 is also concentric with center 541. Contacts 538 are disposed on the first surface 532 of body 520 in registration with holes 536, so that the centers 541 of the contacts are concentric with the central axes 552 of holes 536. The arcuate edges 543 of the slots in the contacts are disposed at the periphery of the openings of holes 536 on the first surface 532. Thus, the projections 542 of each contact extend inwardly from the ring-like structure 538 over the associated hole 536. The outer edges 540 of adjacent ring-like structures are separated from one another by small gaps 554 therebetween. Each contact is physically and electrically connected to the through conductor or the liner 548 of the associated hole by joining portions 556 formed integrally with the via liners and extending on the undersurface of the ring-like portion 538 and projections 542 of the contact. Each contact 538 is further physically secured to the dielectric layer 537 on first circuit 532 by an adhesive layer (not shown) disposed between the contact and the dielectric layer of the connector body. The individual contacts are electrically isolated from one another.

This structure may be fabricated, for example, by applying the metal which forms contacts 538 as an uninterrupted sheet over the body 520 and the adhesive layer and then forming the liners 548, joining sections 556 and terminals 550 by seeding and electroless plating with or without electroplating. At this stage of the process, the sheet which is to form the contacts closes the first-surface of the holes 536, and the plated material is deposited on the undersurface of this sheet, inside the holes. After the plating process, the continuous sheet is etched from the top or first surface so as to form gaps 554 between the separate contacts and so as to form the slots 544 in each contact, thereby forming the individual projections 542. The bottom surface may also be etched, if necessary, to assure separation between the terminal regions 550 associated with the individual holes.

In this condition, the connector may be employed in substantially the same way as the connector discussed above. Thus, the connector may be disposed on the substrate so that the first surface of the connector, with the contacts thereon, forms a mounting surface of the mounting assembly. Terminals 550 on the second surface of the connector are electrically connected to leads within the substrate, as by bonding materials on the substrate or on the terminals, thereby electrically connecting the contacts 538 to the leads of the substrate. Once again, one or more microelectronic devices are positioned on the first surface of the connector and bump leads on the microelectronic elements penetrate into the holes 536 and engage the projections of the contacts. This serves to connect the microelectronic elements to the leads within the substrate, through the liners 548 and terminals 550. This structure provides a low inductance connection between the contacts 538 and the terminals. In this arrangement, there is no need for conductive vias separate from the bump-lead receiving holes. Instead, the holes 536 provide room for the through conductors or liners. Stated another way, the holes serve both to receive the bump leads of the microelectronic component and also to carry the conductors through the connector body. This allows for a very compact arrangement. The pitch or spacing between adjacent holes and contacts can be just slightly larger than the maximum diameters of the holes themselves and only slightly larger than the diameters of the bump leads to be received within the holes. Thus, the pitch may be about three times the bump lead diameter or less, and desirably as low as about twice the bump lead diameter. Suitable dimensions for various pitches are given in Table I below. In the table, bump lead diameter refers to the diameter of a ball-shaped bump lead on the microelectronic element. Maximum hole diameter refers to the diameter of the hole in body 520 at the first surface 532. Slot diameter refers to the dimension between opposite arcuate edges 543 of the slots, whereas the dielectric layer thickness refers to the thickness of the dielectric layer 537 and the contact refers to the thickness of the metal layer constituting the contacts and the projections 542.

TABLE I

|  | (mm) | (mm) | (mm) |
|---|---|---|---|
| Pitch | 0.5 | 1.0 | 1.5 |
| Bump Diameter | 0.25 | 0.4 | 0.5 |
| Hole Diameter | 0.35 | 0.6 | 0.7 |
| Slot Dimension | 0.45 | 0.9 | 1.4 |
| Dielectric Thickness | 0.04 | 0.04 | 0.04 |
| Contact Thickness | 0.025 | 0.025 | 0.025 |

Figure 15:
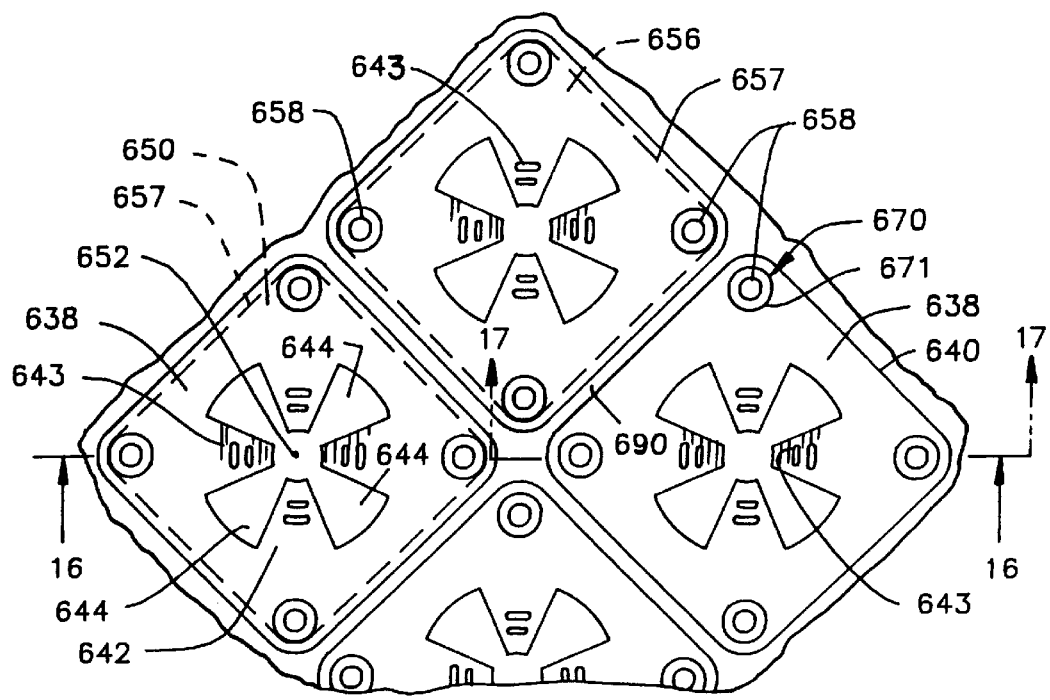
FIG. 15 is a fragmentary, diagrammatic plan view of a sheet socket component according to yet a further embodiment of the invention.
Figure 16:
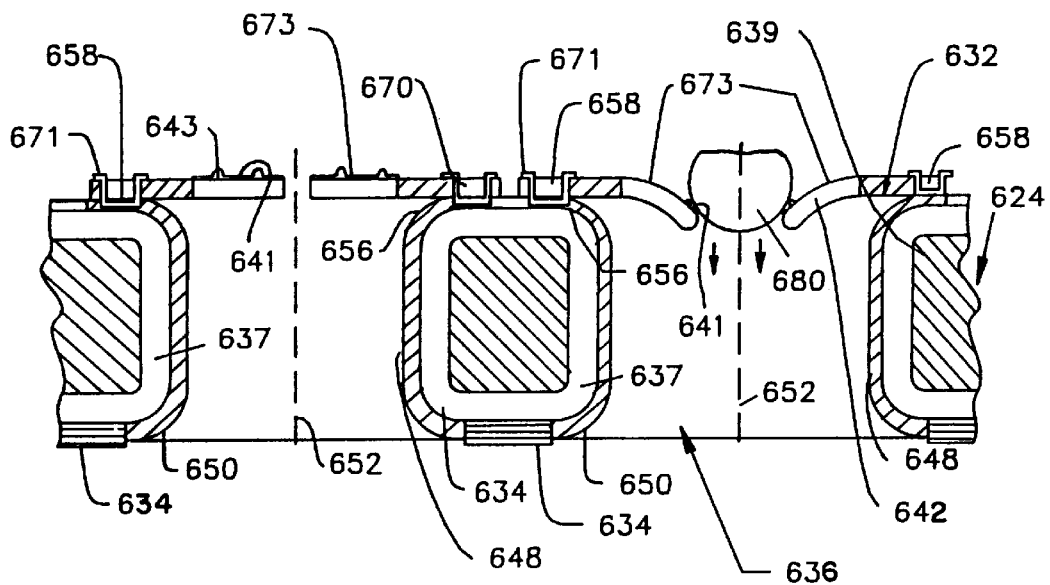
FIG. 16 is a diagrammatic sectional view taken along lines 16—16 in FIG. 15, depicting the sheet socket component in conjunction with a bump portion of a microelectronic element.

A connector according to a further embodiment of the invention, depicted in the plane view FIG. 15 and in the sectional view FIG. 16, includes a sheet-like connector body 624 incorporating a metallic element 639 and dielectric coating 637 similar to the corresponding elements discussed above with reference to FIG. 14. Thus, the metallic element 639 has holes 636 therein and is entirely covered by the dielectric coating or layers 637. Each hole 636 has a central axis 652. Once again, the body 624 has a first major surface 632 and second major surface 634. Each hole is provided with a conductive, metallic via liner 648 extending from adjacent first surface to adjacent the second surface and closely overlying the wall of the hole. Each via liner 648 flares radially outwardly away from the central axis 652 the associated hole at the second surface of the body so as to form an annular terminal 650 at the second-surface end of each hole 636. Each via liner 648 also flares outwardly, away from the central axis 652 of the hole at the first surface 632 of the body. Thus, each via liner terminates in a contact support 656 extending outwardly, away from the central axis of the hole over the first surface. As best seen in FIG. 15, the outer periphery of each contact support has a generally square boundary 657. Each contact support has a set of four attachment protrusions or posts 658 extending upwardly, away from contact support. Posts 658 are disposed and remote from the associated hole 636, and particularly, removed from the central axis 652 of the hole.

The connector further includes a plurality of laminar contacts 638 each generally in the form of a ring having a square outer peripheral boundary 640. The contacts are disposed on the first surface of the connector body, with the center of each square ring being disposed in alignment with the center of the hole 636 and with the peripheral boundary 640 of the ring and being substantially aligned with the peripheral boundary 657 of the associated contact support. Each contact includes a set of four protrusions 642 extending inwardly from the ring 638 and extending over the associated hole 636 in the connector body. Each projection has a pair of asperities 643 projecting upwardly from the top or engagement surface 641 of the projection, i.e., upwardly away from the connector body 624 and away from the associated hole 636. As illustrated, the asperities 643 are in the form of ribs extending transverse to the direction of elongation of the projection and as disclosed adjacent to the tip of each projection. The height of the asperities may be comparable to the thickness of the laminar projection itself, i.e., typically less than about 0.03 mm. As in the embodiments discussed above, slots 644 extended between projections 642.

Each contact has four apertures 670 disposed adjacent the corners of the ring. The apertures of each contact or ring are aligned with the blind vias, so that the wall of the posts 658 protrude upwardly, through the ring. Each post has a rim or bulbous portion or enlarged locking protrusion 671 at the end of the post remote from the connector body. These locking protrusions 671 overlie the contact rings 638 and lock the contact rings 638 to the contact support 656. In effect, posts 658 and locking protrusions 671 act as rivets. The contacts, including the projections 642 optionally have a layer 673 of a heat activatably conductive bonding material, such as one of the bonding materials discussed above on their respective top surfaces.

In use, the connector is engaged with a microelectronic component having bump leads. One such bump lead 680 is illustrated in FIG. 16 during the engagement process. As illustrated, the contact projections 642 flex downwardly so that the top surface of the contact with asperities 643 thereon bears against the surface of the bump lead 680. The asperities scrape and wipe the surface of the bump lead as the bump lead is engaged with the contact and as the bump lead enters the associated hole 636 in the connector body. Projections 642 bend further as the bump lead 680 penetrates further into holes 636. During this process, the projections may be plastically deformed to the position illustrated in FIG. 17. In this condition, the projections extend substantially vertically, in close proximity to the via liners 648. Even after such plastic deformation, however, the projections will continue to bear resiliently on the bump leads.

Because the apertures 670 and posts 658 are disposed adjacent the corners of each square ring-like contact, remote from the center of the associated hole, the posts and apertures are remote from the projections 642 and slots 644, i.e., remote from the active area of the contact. The posts and apertures do not interfere with the flexing action of the projections. However, because each attachment post 158 is disposed in alignment with one projection 642, the attachment posts are ideally situated to resist stress placed on the joint between the contact and the connector body. Here again, the laminar, ring-like contacts 638 are substantially square and substantially fill the top surface of the connector, with only small gaps therebetween to provide electrical isolation. The dimensions may be similar to those discussed above with reference to FIG. 14.

The connector may also have a dielectric adhesive 685. Dielectric adhesive 685 is disposed on the second surface 634 of the connector body, in the regions between the terminals 650. The dielectric adhesive may be, for example, a snap-cured adhesive as discussed previously. The terminals 650 may be covered with a heat activated conduction bonding material similar to those discussed above, for connection to leads of the substrate.

Connectors as illustrated in FIGS. 15 and 16 may be fabricated by a variety of processes. However, one particularly useful process includes the steps of forming the connector body 624 by providing the metallic structure 639 with the holes therein, applying the conformal dielectric coating layer 637 and then forming the via liners 648 with the terminal 650 and connector support regions 656, but without attachment posts 658. A layer or sheet of metallic material suitable for forming the contact, such as copper or copper alloys such as beryllium copper, phosphor bronze or hard copper and preferably having a thickness in the range of about 10–50 microns is also provided. While the sheet is separate from the connector body, it is partially etched on the bottom side, i.e., the side which will ultimately face towards the connector body in the finished assembly. The partial etching is in areas corresponding to the slots 644, to the strip like gaps 690 between the adjacent contacts and to the holes 670 in the contacts. This partial etching extends partially through the thickness of the sheet, except for the holes 670 which extend completely through the sheet. The partially etched sheet is then laminated to the first surface 632 of the connector body with the etched surface facing the body and held on the surface by a thermoset adhesive. The adhesive may be the conformal dielectric layer 637 or may be separately applied adhesive either on the connector body or on the sheet. In the lamination step, the partially etched regions are placed in registry with the holes and contact supports of the connector body. The assembly is then subjected to a laser ablation process which opens the holes in the sheet at the locations of holes 670 in the finished contacts and exposes the connector supports directly beneath those holes. The laser ablation is performed with an Excimer laser operating at a wavelength of 248 nm, where it will efficiently remove adhesive material from the holes 670 and stop when it reaches the metal of the contact supports. Copper is then selectively plated in the holes and in the regions immediately surrounding the holes to form the attachment posts 658 and the protruding, bulbous regions 671 on the top surface of the connectors. This plating operation also causes the copper to fuse with the material via the sheet and with the material of the contact supports 656, thus providing a secure physical and electrical interconnection at each post.

Following the copper plating step, the top surface is once again etched. The bonding material 673 may be applied before or after this final etching step. If applied prior to etching, certain bonding materials such as gold and gold alloys can act as an etching mask. During the final etching step, the posts 658 are protected by a resist or by another etching mass such as bonding material. Likewise, the areas corresponding to asperities 643 are also protected, preferably by the bonding material. The final etch breaks through the sheet and forms slots 690 separating the sheet into individual square contact rings 638. Also, the final etch breaks through the sheet at the partially etched regions so as to form the slots 644 and thus define the projections 642. The final etching process further forms the raised asperities 643 on the top surfaces of the projections. Before or after the steps described above, the dielectric bonding material 685 on the second surface of the connector body and the conductive bonding material (not shown) on the terminals 650 may be applied. The steps may be performed using substantially conventional application techniques.

In a variant of the embodiment shown in FIGS. 15 and 16, the attachment to the contact support may be provided as raised features surrounding the periphery of the contact ring. For example, ribs (not shown) may project upwardly along side the edges of the individual contacts, and may have projecting sections extending inwardly so as to thereby overlap the edges of each contact.

A mounting assembly 720 in accordance with yet another embodiment of the invention includes a multilayer substrate 721 with conventional leads therein and a connector 724 disposed on a surface of the substrate. Connector 724 has a dielectric connector body 730 with a first major surface 732, second major surface 734 and holes 736 extending therethrough. Metallic contacts, each having a ring-like contact tab 738 are disposed on first surface 732 of the connector body, remote from the substrate. The connector body has vias 748 extending between the top and bottom surfaces, one such via being provided next to each hole 736. Conductive via liners 750 extend through these vias. Each via liner has a terminal 751 at its bottom or second-surface end electrically connected to the leads of substrate 721. These aspects of the structure are similar to those discussed above with reference to FIGS. 1–7.

The ring-like contact tabs 738 of FIGS. 18–19 define holes 741 aligned with the holes 736 in the connector body. Each contact has two projections 742 extending inwardly into the hole from the ring-like contact tab. The two projections of each contact extend from opposite sides of the hole, on opposite sides of a diameter 745. Each projection 742 extends more than halfway across the hole, so that the projections extend alongside one another. Preferably, each projection extends almost to the opposite side of the hole. Each projection has asperities 743 on its top or bump-lead-engaging surface.

The mounting assembly further includes a dielectric stop layer 750 disposed on the first SURFACE 732 of the connector body and also overlying contacts 738, the stop layer having holes 752 in alignment with the holes 736 of the connector body. A resilient retainer 754 extends around the periphery of the connector, and protrudes upwardly from the first surface 732. The retainer has an inwardly-sloping ledge 756 facing downwardly, toward the connector.

In operation, a microelectronic element such as a semiconductor chip 768 with bump leads 770 thereon is engaged with the mounting assembly by juxtaposing the element with connector 724 so that the lead-bearing surface 772 of the element faces toward the first surface 732 of the connector. Bump leads 770 enter holes 752 in the stop layer and holes 736 in the connector body, and engage the projections 742 of the contacts. However, stop layer 750 engages the lead-bearing surface 772 of the microelectronic element and arrests its motion before the bump leads enter all the way into holes 736. Thus, projections 742 are deformed elastically, not plastically. Retainer 754 holds the microelectronic element in position, with the bump leads engaging the contacts. In this condition, the microelectronic element can be operated. The microelectronic element can be removed readily after operation by bending retainer 754 outwardly to release the element. Mounting assemblies according to this embodiment of the invention can be used as test fixtures, in which the microelectronic element is only momentarily engaged, or as permanent mountings.

As will be readily appreciated, numerous other variations and combinations of the features discussed above can be used without departing from the present invention. For example, the bump leads on the microelectronic components need not be either spherical or conical as described above. Cylindrical, hemispherical, oblate and other shapes may be employed. Also, in the process discussed above with reference to FIGS. 1–7, the microelectronic component is forced all the way home for the testing step, so as to provide a very secure resilient inter-engagement between the contact projections and bump lead at the time of the testing step. As an alternative, however, the microelectronic element can be engaged with the mounting assembly and with the connector using only a moderate force, so as to partially engage the bump leads with the contacts during the testing step. For example, the assembly may be brought to the condition illustrated in FIG. 5 and then tested. A temporary stop can be interposed between the microelectronic element and the connector during initial assembly and testing, and then removed during final assembly.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A connector for mounting a microelectronic element to a substrate comprising:

(a) a sheetlike body having first and second major surfaces and having a plurality of holes open to said first major surface, said holes being disposed in an array corresponding to an array of bump leads on the microelectronic device to be mounted;

(b) an array of resilient, generally laminar contacts secured to said first major surface of said body in registration with said holes, each said contact including a ring of a sheetlike metallic contact material overlying the first surface of the body and encircling the opening of the associated hole, each said contact further including at least one projection formed integrally with the ring and extending inwardly over one said hole from said first major surface, each said contact being adapted to resiliently engage a bump lead inserted into the associated hole and to make electrical connection with the bump lead as a result of the resilient engagement, said contact material including a bonding surface layer selected from the group consisting of heat-activatable bonding materials; and (c) an array of terminals electrically connected to said contacts, whereby a microelectronic component can be connected to a substrate by bonding said terminals to said substrate and superposing said microelectronic element on said body so that bump leads on the component protrude into said holes and are engaged by said resilient contacts and thereby electrically connected to them.

2. A connector as claimed in claim 1 wherein said terminals are disposed in an array on said second major surface of said body.

3. A connector as claimed in claim 2 wherein said array of holes on said first major surface substantially overlaps said array of terminals on said second major surface.

4. A connector as claimed in claim 3 wherein said array of holes and said array of terminals are rectilinear arrays having row and column directions, and wherein said terminals are offset from said holes in diagonal directions, oblique to said row and column directions.

5. A connector as claimed in claim 1 wherein said body is less than about 1 mm thick.

6. A connector as claimed in claim 5 wherein said holes extend entirely through said body, from said first major surface to said second major surface.

7. A connector as claimed in claim 1 wherein said at least one projection has an engagement surface facing upwardly, away from said body, so that the engagement surface of said projection will engage and wipe the bump lead when the bump lead is inserted into the hole and wherein at least some of said engagement surfaces have asperities thereon.

8. A connector as claimed in claim 1 wherein said at least one projection is elongated and wherein said asperities include a plurality of said projections at longitudinally-spaced locations on each said projection.

9. A connector as claimed in claim 8 wherein each said rib is less than about 0.06 mm in height above said body.

10. A connector as claimed in claim 1 wherein each said contact includes only one said projection.

11. A connector as claimed in claim 1 wherein said contact material is between about 10 and 50 microns thick.

12. A connector as claimed in claim 1 wherein said contact material includes a structural layer selected from the group consisting of copper, beryllium copper, and phosphor bronze.

13. A connector as claimed in claim 1 wherein said heat-activatable bonding material is selected from the group consisting of solders, eutectic bonding materials, solid state diffusion bonding materials, and composite bonding materials incorporating metal particles in polymers.

14. A connector as claimed in claim 1 wherein said holes are disposed in a regular, grid-like pattern at intervals of less than about 2.5 mm.

15. A connector for mounting a microelectronic element to a substrate comprising:
(a) a sheet-like body having first and second major surfaces and having a plurality of holes extending through said body from said first major surface to said second major surface so that each said hole has first-surface and second-surface ends, said holes being disposed in an array corresponding to an array of bump leads on the microelectronic device to be mounted, said holes further being disposed in a regular, grid-like pattern at intervals of less than about 2.5 mm;
(b) an array of resilient, generally laminar contacts secured to said first major surface of said body in registration with said holes so that each said contact extends inwardly over one said hole from said first major surface, each said contact being adapted to resiliently engage a bump lead inserted into the associated hole;
(c) an array of terminals electrically connected to said contacts, each said terminal being disposed on said second major surface adjacent the second-surface end of one said hole; and
(d) through conductors extending within said hole, the contact and terminal associated with each said hole being connected to one another by the through conductor extending within such hole;
(e) whereby a microelectronic component can be connected to a substrate by bonding said terminals to said substrate and superposing said microelectronic element on said body so that bump leads on the component protrude into said holes and are engaged by said resilient contacts.

16. A connector as claimed in claim 15 wherein each said through conductor is a hollow conductive via liner substantially lining the associated hole.

17. A connector as claimed in claim 16 wherein each said via liner has a terminal portion flaring outwardly, away from the center of the associated hole at the second-surface end thereof, said terminal portions of said via liner constituting said terminals.

18. A connector as claimed in claim 16 wherein each said via liner has a contact support portion flaring outwardly, away from the center of the associated hole at the first-surface end thereof, each said contact including a ring of a sheetlike metallic contact material overlying the contact support portion of the associated via liner and encircling the opening of the associated hole, each said ring being connected to the contact support portion of the associated via liner remote from the hole, each said contact further including at least one projection formed integrally with the ring and extending inwardly therefrom over the hole.

19. A connector as claimed in claim 18 wherein each said contact includes a plurality of said projections extending inwardly from circumferentially spaced locations on the ring so that said projections of each said contact are cantilevered over the associated hole in the body.

20. A connector as claimed in claim 18 wherein each said contact support has an attachment protruding upwardly, away from said body remote from the associated hole, each said attachment having a locking protrusion overlying the associated ring so as to lock the ring to the contact support.

21. A connector as claimed in claim 20 wherein each said attachment includes a plurality of posts attached to each contact support at circumferentially spaced locations around the associated hole and radially outwardly therefrom, each said ring having a plurality of apertures aligned with said posts, said posts protruding through said apertures and in said rings, each said locking protrusion including bulbous portions of said posts at an end remote from the contact support, said bulbous portions securing said rings to said contact supports.

22. A connector as claimed in claim 21 wherein each said ring has an exterior border substantially in the form of a square and wherein said apertures and posts are disposed adjacent the corners of each such square.

23. A connector for mounting a microelectronic element to a substrate comprising:
(a) a sheet-like body having first and second major surfaces and having a plurality of holes open to said first major surface, said holes being disposed in an array corresponding to an array of bump leads on the microelectronic device to be mounted;
(b) an array of resilient, generally laminar contacts secured to said first major surface of said body in registration with said holes, each said contact including a ring of sheet-like metallic contact material overlying the first surface of the body and encircling the opening of the associated hole, wherein each said contact includes a plurality of projections formed integrally with the ring and extending inwardly from circumferentially spaced locations on the ring so that said projections of each said contact are cantilevered over the associated hole in the sheet-like body and adapted to resiliently engage a bump lead inserted into the associated hole, said contact material including a bonding surface layer selected from the group consisting of heat-activatable bonding materials; and
(c) an array of terminals electrically connected to said contacts, whereby a microelectronic component can be connected to a substrate by bonding said terminals to said substrate and superposing said microelectronic element on said body so that bump leads on the component protrude into said holes and are engaged by said resilient contacts.

24. A connector as claimed in claim 23 wherein each said projection extends downwardly from said first surface into the associated hole so that the projections associated with each said hole define a generally conical structure.

25. A connector as claimed in claim 23 wherein each said projection is tapered from a relatively wide portion at the juncture of the projection with the ring to a relatively narrow tip remote from the ring.

26. A connector as claimed in claim 25 wherein said projections extend substantially radially inwardly from the ring, so that the tips of the projections are disposed adjacent one another and adjacent the center of the associated hole in said dielectric layer.

27. A connector as claimed in claim 23 wherein the projections of each said contact extend circumferentially with respect to the associated ring as well as inwardly.

28. A connector as claimed in claim 27 wherein said projections are elongated.

29. A connector for mounting a microelectronic element to a substrate comprising:
   (a) a sheetlike body having first and second major surfaces and having a plurality of holes open to said first major surface, said holes being disposed in an array corresponding to an array of bump leads on the microelectronic device to be mounted;
   (b) an array of resilient, generally laminar contacts secured to said first major surface of said body in registration with said holes so that each said contact extends inwardly over one said hole from said first major surface, each said contact being adapted to resiliently engage a bump lead inserted into the associated hole; and
   (c) an array of terminals electrically connected to said contacts, whereby a microelectronic component can be connected to a substrate by bonding said terminals to said substrate and superposing said microelectronic element on said body so that bump leads on the component protrude into said holes and are engaged by said resilient contacts:
   (d) wherein each said contact includes a resilient metallic contact material and a selectively actuatable bonding material adapted to form a bond only upon application of a preselected activation process, whereby the microelectronic element can be engaged with said contacts without activating said bonding material and then permanently connected to said contacts by applying said activation process.

30. A connector as claimed in claim 29 wherein said bonding material is heat-activatable.

31. A mounting assembly for mounting and connecting a microelectronic element comprising:
   (a) a substrate, said substrate having electrically conductive leads therein;
   (b) means defining at least one mounting surface on said substrate including a first sheet-like dielectric connector body overlying a surface of said substrate, said connector body having a first surface facing away from said substrate, a second surface facing toward said substrate and holes open to said mounting surface and extending inwardly toward said substrate, wherein said first connector body is less than about 1 mm thick and wherein said holes extend entirely through said first connector body;
   (c) an array of resilient laminar contacts secured to each said mounting surface in registration with said holes so that each said contact extends over one said hole, each said contact being adapted to resiliently engage a bump lead inserted into the associated hole, and to make electrical connection with the bump lead as a result of the resilient engagement, said contacts being electrically connected to said leads in said substrate so that a microelectronic component can be engaged with said mounting assembly and electrically connected thereto by way of resilient engagement between bump leads and said contacts; and
   (d) an electrically conductive via liner in each said hole in said first connector body electrically connecting said contacts to said substrate.

32. A mounting assembly as claimed in claim 31 wherein said substrate is generally planar and defines oppositely facing top and bottom surfaces, said means for defining at least one mounting surface defining top and bottom mounting surfaces with said holes extending through said top and bottom surfaces, said contacts overlying said holes on said top and bottom mounting surfaces.

33. A mounting assembly as claimed in claim 31 wherein said holes are disposed in a regular grid, the mounting assembly further comprising means for covering part of said grid so as to leave only one or more selected parts exposed.

34. An electronic assembly comprising:
   (a) a mounting assembly having a substrate with electrically conductive leads therein, means defining at least one mounting surface on said substrate and holes open to each said mounting surface and extending inwardly toward said substrate, and an array of resilient laminar contacts secured to each said mounting surface in registration with said holes so that each said contact extends over one said hole, said contacts being electrically connected to said leads in said substrate; and
   (b) at least one microelectronic element, each such element having a bottom surface and a plurality of bump leads protruding from such bottom surface, each such bump lead having a side portion, each such microelectronic element being mounted on said mounting assembly, the bottom surface of each such element confronting a mounting surface of the mounting assembly, the bump leads of the element protruding into the holes of such mounting surface, the side portions of the bump leads engaging the contacts at such holes so that the bump leads are electrically connected to the leads of said substrate through said contacts, and said bump leads of at least one said microelectronic element being bonded to said contacts.

35. An assembly as claimed in claim 34 wherein said at least one microelectronic element includes a plurality of microelectronic elements, said elements being interconnected to one another through said leads of said substrate, said contacts and said bump leads.

36. An assembly as claimed in claim 34 wherein each said contact includes a ring encircling the opening of one said hole in the mounting surface and a plurality of said projections extending inwardly from circumferentially spaced locations on the ring to the bump lead engaged with to contact so that the projections of each contact bear on the bump lead within the hole.

37. An assembly as claimed in claim 34 wherein at least one said microelectronic element is releasably engaged with said mounting assembly, the bump leads of each such element being releasably engaged with said contacts.

38. A connector for mounting a microelectronic element to a substrate comprising:
   (a) a sheetlike body having first and second major surfaces and having a plurality of holes open to said first major surface, said holes being disposed in an array corresponding to an array of bump leads on the microelectronic device to be mounted;
   (b) an array of resilient, generally laminar contacts secured to said first major surface of said body in registration with said holes, each said contact including a ring of a sheetlike metallic contact material overlying the first surface of the body and encircling the opening of the associated hole, each said contact further including only one single projection formed integrally with the ring and extending inwardly over one said hole from said first major surface, each said contact being adapted to resiliently engage a bump lead inserted into the associated hole and to make electrical connection with the bump lead as a result of the resilient engagement; and (c) an array of terminals electrically connected to said contacts, whereby a microelectronic component can be connected to a substrate by bonding said terminals to said substrate and superposing said microelectronic element on said body so that bump leads on the component protrude into said holes and are engaged by said resilient contacts and thereby electrically connected to them.

39. A connector as claimed in claim 38 wherein said terminals are disposed in an array on said second major surface of said body.

40. A connector as claimed in claim 39 wherein said array of holes on said first major surface substantially overlaps said array of terminals on said second major surface.

41. A connector as claimed in claim 40 wherein said array of holes and said array of terminals are rectilinear arrays having row and column directions, and wherein said terminals are offset from said holes in diagonal directions, oblique to said row and column directions.

42. A connector as claimed in claim 38 wherein said body is less than about 1 mm thick.

43. A connector as claimed in claim 42 wherein said holes extend entirely through said body, from said first major surface to said second major surface.

44. A connector as claimed in claim 38 wherein said contact material is between about 10 and 50 microns thick.

45. A connector as claimed in claim 38 wherein said contact material includes a structural layer selected from the group consisting of copper, beryllium copper, and phosphor bronze.

46. A connector as claimed in claim 38 wherein said holes are disposed in a regular, grid-like pattern at intervals of less than about 2.5 mm.

47. A connector for mounting a microelectronic element to a substrate comprising:

(a) a sheet-like body having first and second major surfaces and having a plurality of holes open to said first major surface, said holes being disposed in an array corresponding to an array of bump leads on the microelectronic device to be mounted, said holes further being disposed in a regular, grid-like pattern at intervals of less than about 2.5 mm;

(b) an array of resilient, generally laminar contacts secured to said first major surface of said body in registration with said holes so that each said contact extends inwardly over one said hole from said first major surface, each said contact being adapted to resiliently engage a bump lead inserted into the associated hole and to make electrical connection with the bump lead as a result of the resilient engagement; and (c) an array of terminals on said second major surface of said body electrically connected to said contacts, whereby a microelectronic component can be connected to a substrate by bonding said terminals to said substrate and superposing said microelectronic element on said body so that bump leads on the component protrude into said holes and are engaged by said resilient contacts and thereby electrically connected to them;

wherein said array of holes and said array of terminals substantially overlap and are rectilinear arrays having row and column directions, and wherein said terminals are offset from said holes in diagonal direct ions, oblique to said row and column directions.

48. A connector as claimed in claim 47 wherein said body is less than about 1 mm thick.

49. A connector as claimed in claim 48 wherein said holes extend entirely through said body, from said first major surface to said second major surface.

50. A connector as claimed in claim 47 wherein each said contact includes a ring of a sheetlike metallic contact material overlying the first surface of the body and encircling the opening of the associated hole, each said contact further including at least one projection formed integrally with the ring and extending inwardly therefrom over the hole.

51. A connector as claimed in claim 50 wherein said contact material is between about 10 and 50 microns thick.

52. A connector as claimed in claim 50 wherein said contact material includes a structural layer selected from the group consisting of copper, beryllium copper, and phosphor bronze.

53. A connector for mounting a microelectronic element to a substrate comprising:

(a) a sheet-like body having first and second major surfaces and having a plurality of holes extending through said body from said first major surface to said second major surface so that each said hole has first-surface and second-surface ends, said holes being disposed in an array corresponding to an array of bump leads on the microelectronic device to be mounted;

(b) an array of resilient, generally laminar contacts secured to said first major surface of said body in registration with said holes so that each said contact extends inwardly over one said hole from said first major surface, each said contact being adapted to resiliently engage a bump lead inserted into the associated hole;

(c) an array of terminals electrically connected to said contacts, each said terminal being disposed on said second major surface adjacent the second-surface end of one said hole; and (d) hollow, conductive via liners substantially lining said holes, the contact and terminal associated with each said hole being connected to one another by the via liner lining such hole, each said via liner having a contact support portion flaring outwardly, away from the center of the associated hole at the first-surface end thereof, each said contact including a ring of a sheet-like metallic contact material overlying the contact support portion of the associated via liner and encircling the opening of the associated hole, each said ring being connected to the contact support portion of the associated via liner remote from the hole, each said contact further including at least one projection formed integrally with the ring and extending inwardly therefrom over the hole; each said contact support having an attachment protruding upwardly, away from said body remote from the associated hole, each said attachment having a locking protrusion overlying the associated ring so as to lock the ring to the contact support;

(e) whereby a microelectronic component can be connected to a substrate by bonding said terminals to said substrate and superposing said microelectronic element on said body so that bump leads on the component protrude into said holes and are engaged by said resilient contacts.

54. A connector as claimed in claim 53 wherein each said attachment includes a plurality of posts attached to each contact support at circumferentially spaced locations around the associated hole and radially outwardly therefrom, each said ring having a plurality of apertures aligned with said posts, said posts protruding through said apertures and in said rings, each said locking protrusion including bulbous portions of said posts at an end remote from the contact support, said bulbous portions securing said rings to said contact supports.

55. A connector as claimed in claim 54 wherein each said ring has an exterior border substantially in the form of a square and wherein said apertures and posts are disposed adjacent the corners of each such square.

56. A mounting assembly for mounting and connecting a microelectronic element comprising:
   (a) a substrate, said substrate having electrically conductive leads therein;
   (b) means defining at least one mounting surface on said substrate and holes open to said mounting surface and extending inwardly toward said substrate, said holes being disposed in a regular grid;
   (c) an array of resilient laminar contacts secured to each said mounting surface in registration with said holes so that each said contact extends over one said hole, each said contact being adapted to resiliently engage a bump lead inserted into the associated hole, and to make electrical connection with the bump lead as a result of the resilient engagement, said contacts being electrically connected to said leads in said substrate so that a microelectronic component can be engaged with said mounting assembly and electrically connected thereto by way of resilient engagement between bump leads and said contacts; and
   (d) means for covering part of said hole grid so as to leave only one or more selected parts exposed.

57. A mounting assembly as claimed in claim 56, wherein said means defining a mounting surface include a first sheet-like dielectric connector body overlying a surface of said substrate, said connector body having a first surface facing away from said substrate, and a second surface facing toward said substrate.

58. A mounting assembly as claimed in claim 57, wherein each said hole in said first connector body has an electrically conductive via liner therein, said contacts being electrically connected to said substrate through said via liners.

59. A mounting assembly as claimed in claim 56 wherein said first connector body is less than about 1 mm thick and wherein said holes extend entirely through said first connector body.

60. A mounting assembly as claimed in claim 56 wherein said substrate is generally planar and defines oppositely facing top and bottom surfaces, said means for defining at least one mounting surface defining top and bottom mounting surfaces with said holes extending through said top and bottom surfaces, said contacts overlying said holes on said top and bottom mounting surfaces.

* * * * *

UNITED STATES PATENT AND TRADEMARK OFFICE
CERTIFICATE OF CORRECTION

PATENT NO. : 5,812,378
DATED : September 22, 1998
INVENTOR(S) : Fjelstad et al.

It is certified that error appears in the above-identified patent and that said Letters Patent is hereby corrected as shown below:

In the Abstract, line 8, "such a" should read --such as a--.
Column 3, line 23, delete "a" (first occurrence).
Column 5, line 16, "sheet like" should read --sheet-like--.
Column 5, line 44, "at-the" should read --at the--.
Column 5, line 48, "linersubstantially" should read --liner substantially--.
Column 11, line 41, "orelectroless" should read --or electroless--.
Column 14, line 16, "lead" should read --leads--.
Column 18, line 45, "652 the" should read --652 of the--.
Column 21, line 29, "SURFACE" should read --surface--.
Column 22, line 67, "of said" should read --of each said--.
Column 23, line 6, "of said projections at" should read --of ribs at--.
Column 23, line 7, "8" should read --1--.
Column 26, line 52, " with to" should read --with the--
Column 27, line 5, delete "single".
Column 28, line 7, "direct ions," should read --directions,--

Signed and Sealed this

Eighteenth Day of May, 1999

Attest:

Q. TODD DICKINSON

Attesting Officer

Acting Commissioner of Patents and Trademarks